(12) United States Patent
Shinagawa et al.

(10) Patent No.: US 7,061,812 B2
(45) Date of Patent: Jun. 13, 2006

(54) MEMORY CARD

(75) Inventors: Chiaki Shinagawa, Kodaira (JP);
Motoki Kanamori, Tachikawa (JP);
Atsushi Shiraishi, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 95 days.

(21) Appl. No.: 10/815,811

(22) Filed: Apr. 2, 2004

(65) Prior Publication Data

US 2004/0202024 A1 Oct. 14, 2004

(30) Foreign Application Priority Data

Apr. 8, 2003 (JP) ........................... 2003-103560

(51) Int. Cl.
*G11C 16/04* (2006.01)

(52) U.S. Cl. .............. 365/185.29; 365/218; 365/185.24
(58) Field of Classification Search ............ 365/185.29, 365/218, 185.24
See application file for complete search history.

(56) References Cited

U.S. PATENT DOCUMENTS 5,611,067 A * 3/1997 Okamoto et al. ........... 395/430
5,636,162 A * 6/1997 Coffman et al. ....... 365/185.22
6,078,519 A   6/2000 Kanamitsu et al. .... 365/185.03
6,400,603 B1 * 6/2002 Blyth et al. ............ 365/185.12

FOREIGN PATENT DOCUMENTS

JP     11-345494     12/1999

* cited by examiner

*Primary Examiner*—Son T. Dinh
(74) *Attorney, Agent, or Firm*—Miles & Stockbridge P.C.

(57) ABSTRACT

Disclosed is a memory card which ensures high-speed data writing operations. The memory card is formed of an erasable and programmable nonvolatile memory and a control circuit. A memory array of the nonvolatile memory has an erasing table including a first flag designating whether a memory area is a vacant area or not in every erasing unit. The control circuit exercises, when the number of memory areas in which the erasable data is written becomes a constant value, pre-erasing control to previously erase the erasable data over the memory area depending on the first flag indicating a vacant area. Since the erasing process is previously executed to the vacant memory area, necessity for insertion of the erasing process just before the writing process using the vacant memory area can be reduced and thereby writing data to the memory card can be highly speeded.

12 Claims, 18 Drawing Sheets

MEMORY CARD

CROSS-REFERENCE TO RELATED APPLICATION

The present application claims priority from Japanese patent application JP 2003-103560 filed on Apr. 8, 2003, the content of which is hereby incorporated by reference into this application.

BACKGROUND OF THE INVENTION

The present invention relates to a memory card comprising an erasable and programmable nonvolatile memory, for example, a flash memory and the technology which can be applied effectively to high-speed data writing operation.

Data writing to a memory card comprising a flash memory is performed after storing the writing data to a buffer from a host computer and then erasing sectors of physical address for data writing. Since the sectors are erased before the data writing, distribution of threshold voltage in the memory cell considered as the abject of data writing may be formed previously to the desirable distribution form.

However, if the operation power source is disconnected during the erasing operation or before the completion of writing operation, sector data not considered as the object of data writing may be lost in some cases. Namely, since a plurality of sectors are all considered as the object of the data writing process even if only a part of sectors is updated when data writing is performed in unit of a plurality of sectors within the flash memory, a plurality of sectors in unit of data writing are all lost due to unwanted disconnection of power source.

An example of the erasing process in the flash memory is described in the patent document 1.

[Patent Document 1]

Japanese Unexamined Patent Publication No. Hei 11(1999)-345494

SUMMARY OF THE INVENTION

The inventors of the present invention proposed, in the publicly unknown patent application (Patent Application No. 2002-294060), the memory card in which the stored information was never lost undesirably even when the operation power source was disconnected during the erasing and writing operation. Namely, an erasing table corresponding to a vacant information flag is prepared for each memory area in the storage management of memory card and the data before reprogramming is left in the memory area even after the reprogramming by determining, during the data writing to the memory card, the memory area to which the reprogramming data is written with reference to the vacant information flag of the erasing table and writing the data to the memory area which is different from that before reprogramming. Even if unwanted disconnection of power source is generated during the erasing operation, data can be recovered by utilizing the data which is still left in the original memory area.

In the data writing of such table system, writing of data to the new sectors and erasing of old data are not performed and the old data can be left by updating only the erasing table. However, since the old data is left as it is, the number of sectors in which unwanted data is still written increases and therefore data must be erased before new data is written to these sectors. When erasing operation is performed before each data writing operation, the data writing velocity of memory card becomes slow.

An object of the present invention is to provide a memory card which can realize high-speed data writing operation.

Another object of the present invention is to provide a memory card which can recover the data even if unwanted disconnection of power source is generated during data erasing operation and realize high-speed data writing operation.

The aforementioned and the other objects and novel features of the present invention will become apparent from the description of the specification and the accompanying drawings.

The typical inventions of the present invention disclosed in the present specification will be briefly described below.

[1] A memory card comprises an erasable and programmable nonvolatile memory and a control circuit. A memory array of the nonvolatile memory includes an erasing table having a first flag indicating whether each memory area is vacant area or not in every erasing unit and also includes a plurality of memory cells having the predetermined threshold voltage. The control circuit performs pre-erasing control for previously erasing the predetermined memory area corresponding to the first flag indicating a vacant area without relation to the external instruction for operation which instructs an address for alteration of threshold voltage. Since the erasing process is performed previously to the vacant memory area, necessity for insertion of the erasing process just before the data writing process using the vacant memory area is lowered and thereby data writing velocity to the memory card can be improved.

As the practical profile of the present invention, a second flag indicating whether the memory area is erased or not depending on the first flag indicating the vacant area or not is further provided and the control circuit considers, as the object of the erasing process, the memory area which is indicated as the vacant with the first flag and as the non-erased area with the second flag in the pre-erasing control in order to eliminate useless duplicated erasing operation. The second flag is included to the erasing table, for example, with the first flag.

The control circuit alters, in the pre-erasing control, the corresponding second flag to the condition indicating the erased area after the completion of the erasing process for the memory area as the object of erasing process. Accordingly, the erased area and the not-erased area can be discriminated easily.

The control circuit executes the control for assigning the memory area which is indicated as the vacant area with the first flag and as the erased area with the second flag to a new memory area for writing the updating data. A memory area which is different from the memory area of the writing source region can be determined as the new writing area at the time of reprogramming the data. Even if unwanted disconnection of power source is generated during the data writing operation, the lost data can be recovered because the data is left in the memory area of the writing source region immediately after generation of such disconnection of power source.

The control circuit updates the corresponding first flag to the condition indicating the vacant area after the data is written into the new memory area. Even if unwanted disconnection of power source is generated during the data writing operation to the new memory area, it can be guaranteed that the original data is left in the original memory area.

A memory array of the nonvolatile memory further includes an address translation table indicating correspondence between logical addresses and physical addresses of the memory area. The control circuit updates the address transmission table through correspondence between the physical address of memory area to which the data is written and the logical addresses after the data is written into the new memory area assigned on the basis of the first flag and second flag but before the corresponding first flag is updated to the condition indicating the vacant area. Here, it is also guaranteed that the original memory area can be set to the searching condition for recovery of data.

[2] Following conditions, for example, can be considered as triggers for shifting to the pre-erasing control. First, the pre-erasing control is executed in response to the power-on of the memory card. Second, the pre-erasing control is executed in parallel to the encryption process or decoding process by the cipher calculation processing circuit in response to the predetermined security command. As the pre-condition, a memory card includes a cipher calculation processing circuit which may be employed in an IC card. Third, the pre-erasing control is executed in response to the predetermined exclusive command. The exclusive command is different from a mere erasing command which is executed by designating an erasing object address. The exclusive command used here is never accompanied with designation of the erasing object address. Fourth, the pre-erasing control is started in response to the completion of the command process. When an instruction by another command is issued before or after the start of the erasing operation by the pre-erasing control, the pre-erasing control process is cancelled and the process of another command is executed preferentially in order to eliminate delay of the process such as read process having the higher priority.

[3] The memory card according to another aspect of the present invention is also provided with the profile that an erasable area is erased in response to a command which is different from the command accompanied with designation of the address to change the threshold voltage, wherein an erasable and programmable nonvolatile memory and a control circuit are provided, a memory array of the nonvolatile memory is provided with a flag information area for storing the flag information indicating whether the memory area can be erased or not in every erasing unit, and the control circuit performs the erase control for erasing the erasable memory area indicated by the flag information in response to the command which is different from the command accompanied by designation of the address to change the threshold voltage.

The memory card according to still another aspect of the present invention is also provided with the profile that the erasable area is erased during the period not responding to commands from the host computer, wherein an erasable and programmable nonvolatile memory and a control circuit are provided, a memory array of the nonvolatile memory is provided with a flag information area for storing the flag information indicating whether the memory area is erasable or not in every erasing unit, and the control circuit erases the erasable memory area indicated by the flag information during the period not responding to the commands supplied from the external side.

The memory card according to the aspects described above is less required to insert the erasing process immediately before the write process because the erasing process is previously executed to the erasable memory area. Accordingly, high-speed data writing can be realized for the memory card.

As the practical profile of the present invention, the flag information is formed, in every erasing unit of memory area, of a pair of the first flag indicating vacant area or no-vacant area and the second flag indicating the erased area or no-erased area of the memory area depending on the first flag indicating the vacant area or no-vacant area.

In this case, the control circuit designates, as the object of erasing process, the memory area which is designated as the vacant area with the first flag and as the no-erased area with the second flag during the erasing control in order to eliminate useless duplicated erasing operation.

The control circuit alters, in the erasing control, the corresponding second flag to the condition indicating the erased area after the completion of the erasing process to the memory area considered as the object of erasing process. Accordingly, the erased area and no-erased area can be discriminated easily.

The control circuit performs the control to assign the memory area indicated as the vacant area with the first flag and as the erased area with the second flag to the new memory area to which the updated data is written. At the time of updating the data, the memory area which is different from the memory area of the writing source area can be designated as the new writing area. Moreover, even if unwanted disconnection of power source is generated during the data writing operation, the lost data can be recovered because the original data is left in the memory area of the writing source area immediately after such disconnection of the power source.

The control circuit updates, after the data writing to the new memory area, the corresponding first flag to the condition indicating the vacant area. It can be guaranteed that the original data is surely left in the original memory area even when unwanted disconnection of power source is generated during the data writing to the new memory area.

The memory array of nonvolatile memory further comprises an address translation table indicating correspondence between the logical addresses and physical addresses and the control circuit updates the address translation table through correspondence between the physical address of memory area to which the data is written and the logical address after the data writing to the new memory area assigned on the basis of the first flag and second flag but before the update of the corresponding first flag to the condition indicating the vacant area but before update of the corresponding first flag to the condition indicating the vacant area. Here, it is also guaranteed that the original memory area can be set to the searching condition for recovery of data.

DETAILED DESCRIPTION OF THE PREFERRED EMBODIMENTS

<Memory Card>

Figure 1:
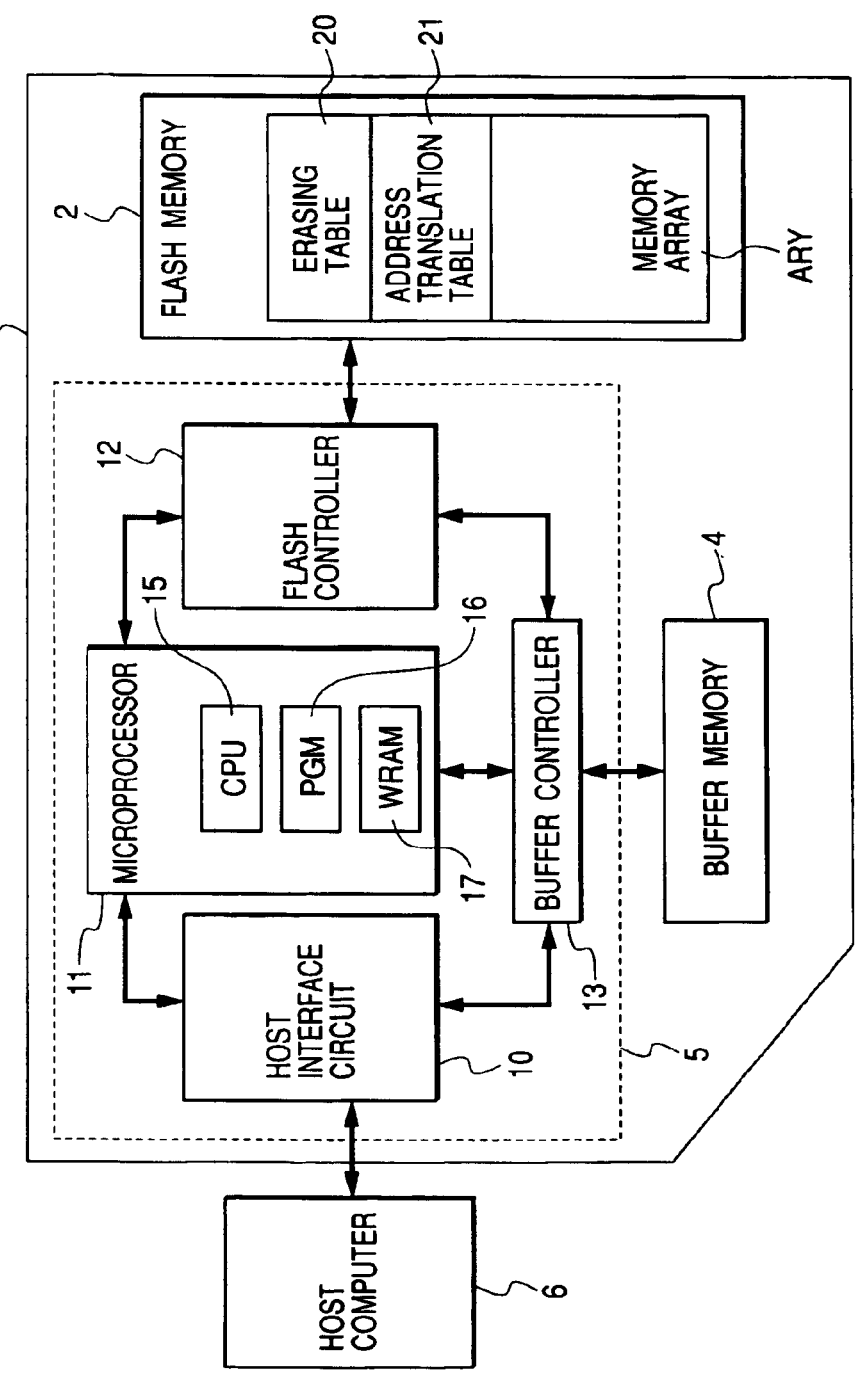
FIG. 1 is a block diagram illustrating an example of the memory card of the present invention.

FIG. 1 illustrates an example of the memory card of the present invention. The memory card 1 is formed by mounting, on a substrate, an erasable and programmable nonvolatile memory, for example, a flash memory 2 and a buffer memory 4 formed of a DRAM (Dynamic Random Access Memory) or an SRAM (Static Random Access Memory) or the like and a card controller 5 for executing memory control and external interface control.

The buffer memory 4 and flash memory 2 are placed under the access control by the card controller 5. The flash memory 2 comprises, although not particularly illustrated, a memory array ARY on which many electrically erasable and programmable nonvolatile memory cell transistors are allocated in the shape of a matrix. The memory cell transistor (also described as flash memory cell) is formed, although not particularly restricted, of a source and a drain formed on the semiconductor substrate or within a well, a floating gate formed via a tunnel oxide film in a channel area between the source and drain and a control gate stacked on the floating gate via an interlayer insulating film. The control gate is connected to a corresponding word line, while the drain, to a corresponding bit line and the source, to a source line. The threshold voltage of memory cell transistor rises when electrons are injected to the floating gate but falls when electrons are extracted from the floating gate. Moreover, the memory cell transistor stores the information depending on the threshold voltage for the word line voltage (applied voltage of the control gate) for reading the data. Although not particularly restricted, the condition where the threshold voltage of the memory cell transistor is low is called the erasing condition, while the condition where the threshold voltage of the memory cell transistor is high, the writing condition in this specification.

In FIG. 1, the card controller 5 executes external interface control in accordance with the IDE disk interface specifications, for example, with a host computer (host apparatus) 6. The card controller 5 has an access control function for accessing the flash memory 2 in accordance with an instruction from the host computer 6. This access control function is the control function for compatibility of hard disk. For example, when the host computer 6 administrates a gathering of sector data as a file data, the card controller 5 executes the access control of the flash memory 2 through the correspondence between the sector address as the logical address and the physical memory address. According to FIG. 1, the card controller 5 is formed of a host interface circuit 10, a microprocessor (MPU) 11 as an arithmetic control means, a flash controller 12 and a buffer controller 13. The flash controller 12 described above is provided with an ECC circuit not illustrated.

The MPU 11 comprises a CPU (central processing unit) 15, a program memory (PGM) 16 and a work RAM (WRAM) 17 in order to totally control the card controller 5. The program memory 16 includes an operation program of the CPU 15.

The host interface circuit 10 is the interface circuit for a personal computer or the host computer 6 such as a work station according to the predetermined protocol such as ATA (attachment), IDE (integrated device electronics), SCSI (small computer interface), MMC (multimedia card), PCM-CIA (personal computer memory card international association) (A trade mark is also included in these protocol names). The host interface operation is controlled by the MPU 11.

The buffer controller 13 controls the memory access operation of the buffer memory 4 depending on the access instruction transmitted from the MPU 11. The data inputted to the host interface 10 or the data outputted from the host interface 10 is temporarily stored in the buffer memory 4. Moreover, the data read from the flash memory 2 or the data written into the flash memory 2 is temporarily stored in the buffer memory 4.

The flash controller 12 controls the read operation, erase operation and write operation for the flash memory 2 depending on the access instruction transmitted from the MPU 11. The flash controller 12 outputs, in the read operation, the read control information such as read command code and read address information, outputs, in the write operation, the write control information such as write command code and write address information, and outputs, in the erase operation, the erase control information such as erase command. The ECC circuit not illustrated generates an error correction code to the data to be written into the flash memory 2 and adds this code to the write data in accordance with the instruction transmitted from the MPU 11. In addition, the read data obtained from the flash memory 2 is subjected to the error detection and correction processes using the error correction code added to the data obtained and the error correction is performed for generation of error within the range of error correction capability.

The flash memory 2 includes, at a part of the memory array ARY thereof, an erasing table 20 and an address translation table 21.

Figure 2:
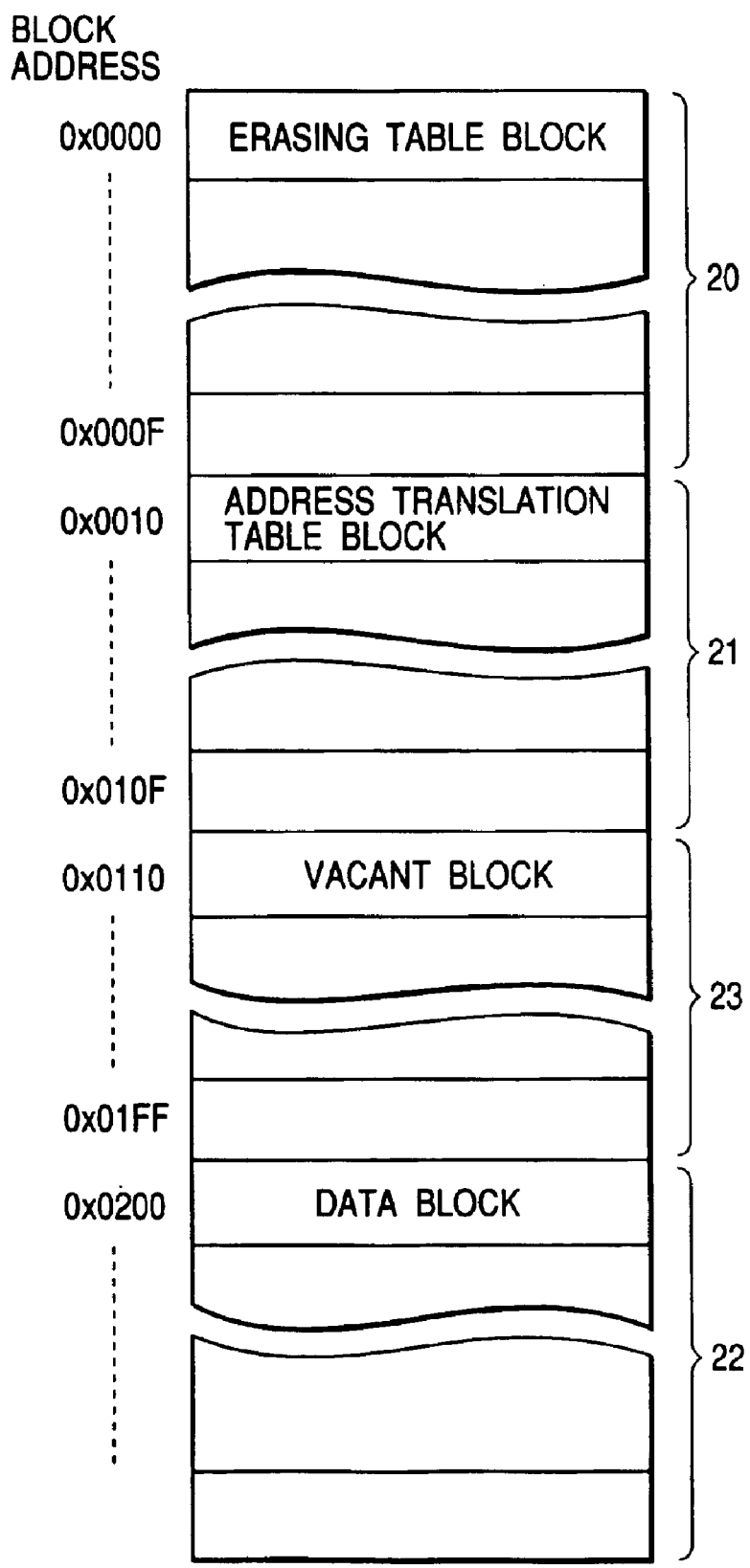
FIG. 2 is a diagram illustrating an example of a storage area of a flash memory.

FIG. 2 illustrates an example of storage area of the flash memory 2. The storage area (memory array ARY) of the flash memory 2 can be roughly classified in to the erasing table 20, the address translation table 21, an user area 22 and a vacant block area 23 which is required for updating the erasing table and address translation table. Each area is given a block address as a physical address in units of memory blocks (memory sectors). The memory block is also described simply as a block. Although not particularly restricted, one block has the storage capacity of about 2 KB (kilobytes) and the memory cell array included in one block is selected with only a word line or a kind of word line selecting signal and is defined as the unit of the erase process and write process. Namely, a high voltage required for the erase process and write process is applied in units of word lines. One block is larger than the capacity of 512 B (bytes) of the sector (storage sector) which is considered as an update unit in the storage such as HDD. For example, one block has the storage capacity obtained by adding the ECC code and management area to four storage sectors.

The erasing table 20 and address translation table 21 are respectively divided and allocated, although not particularly restricted, in block units and each division unit is multiplexed within one block. For example, the erasing table 20 is allocated at the block addresses 1x0000 to 1x000F and is divided such as 1x0000 for every block in block units. The address translation table 21 is allocated at the block addresses 1x0010 to 1x010F and is divided such as 1x0010 for every block in block units.

<Address Translation Table>

Figure 3:
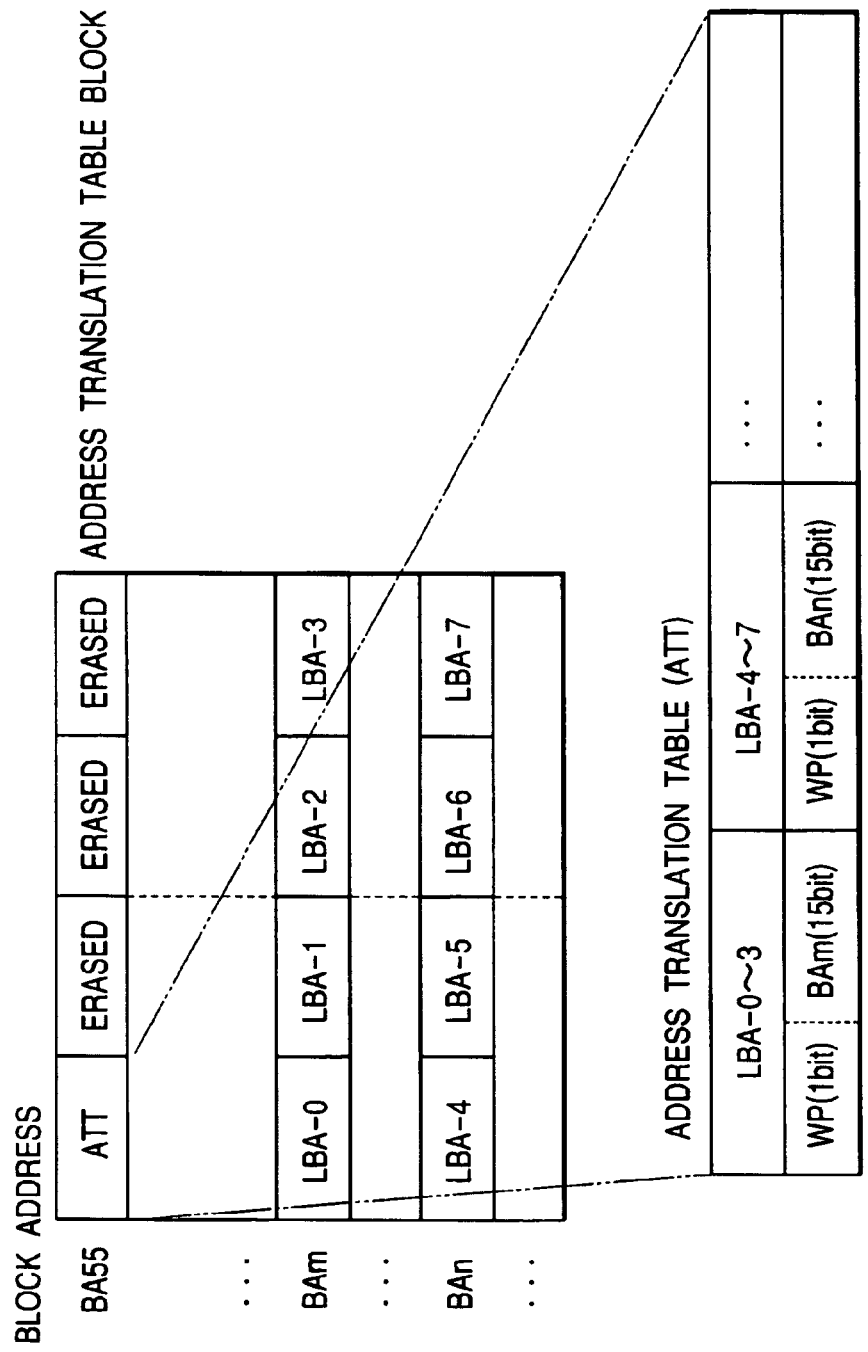
FIG. 3 is a diagram illustrating an example of a detail address translation table block allocated in a part of the address translation table, for example, in the block address.

FIG. 3 illustrates a part of the address translation table 21, for example, details of the address translation table block allocated at the block address BA55. ATT is a divided address translation table and it is multiplexed in "quadruple" including the areas described as "Erased" areas. Only one table among the multiplexed four address translation tables is sequentially validated. The divided address translation table ATT has the physical address of the corresponding memory sector, namely the information corresponding to one block address for every logical address corresponding to four storage sectors. For example, the information indicating the correspondence between the logical address and physical address is stored in such a format that the block address BAm sequentially corresponds to the logical addresses LBA0 to LBA3, while the block address BAn, to the logical addresses LBA4 to LBA7 from the beginning of the address translation table ATT. The logical address information in the address translation table is allocated, for example, in the ascending sequence. Such allocation may also be realized even in the descending sequence. In FIG. 3, the memory block address such as block addresses BAm, BAn means the address of memory block corresponding to the four sectors of continuous logical addresses and has the length, for example, of 15 bits. In this case, a write protect bit WP of one bit is added to every address of the memory block. An address of access object sector (also called as a logical sector address or logical address) is designated to the access instruction to the memory card 1 from the host computer 6 and the corresponding block address is searched with the address translation table using the logical sector address as a search key.

<Easing Table>

Figure 4:
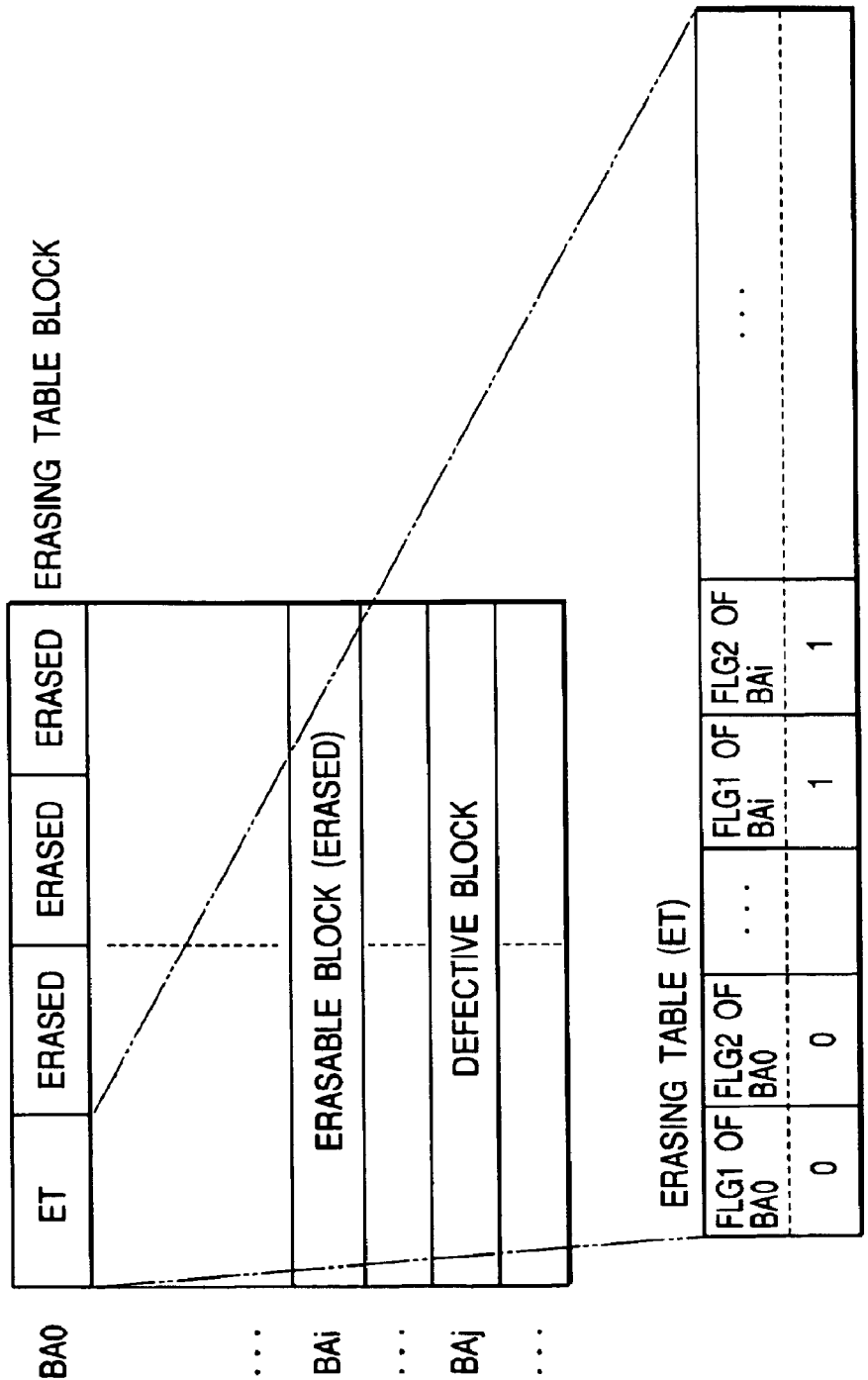
FIG. 4 is a diagram illustrating an example of a detail erasing table block allocated in a part of the erasing table, for example, in the block address.

FIG. 4 illustrates a part of the erasing table 20, for example, details of the erasing table block allocated to the block address BA0. A block designated as ET is a divided erasing block and it is multiplexed in "quadruple" including the "Erased" areas. An erasing table ET among the multiplexed four erasing tables is sequentially validated. The divided erasing table ET corresponds to the flag of vacant information flag (first flag) and the flag of erased area (second flag) for every physical address of memory area, namely for every block address. In short, the erasing table ET is filled sequentially from the beginning area in units of two bits with the bits of flags FLG1, FLG2, in other words, with the vacant information flag FLG1 and erased area flag FLG2 of the top block (block address BA0) and the vacant information flag FLG1 and erased area flag FLG2 of the next block (block address BA1). The vacant information flag FLG1 indicates acknowledgment or no-acknowledgment of erasing of the corresponding block with one bit. The code "1" indicates acknowledgment of erasing, while the code "0", no-acknowledgment of erasing. The erased area flag FLG2 indicates the erased or not-erased area of the corresponding block with one bit. The code "1" indicates the erased area, while the code "0", the not-erased area. The vacant information flag FLG1 and the erased area flag FLG2 in the erasing table are allocated in the ascending sequence of the block address (physical address). Such allocation may be performed also in the descending sequence. Conditions of the corresponding flags FLG1, FLG2 of two bits may be classified into the three modes of the eased memory block (available memory block) by the FLG2=1 and FLG1=1, erasing acknowledgment memory block (not-erased memory block including the erasing acknowledgment data) by the FLG2=0, FLG1=1, and erasing no-acknowledgment memory block (memory block used including effective data) by FLG2=0, FLG1=0.

Here, the control method will be described, in which only one table among the multiplexed four tables (erasing table ET, address translation table ATT) is sequentially validated. The multiplexed validated table can be recognized with an update flag assigned to each block management area. The update flag has four bits in each memory block corresponding to the divided table and is set to "1" when the corresponding divided table is validated to maintain the same condition until the table is erased. The divided table multiplexed in the memory block is sequentially selected. When an area where the update flag is the boundary of "1" and "0" at the beginning in the selecting direction is searched, the divided table corresponding to the update flag of "1" is validated. Location of the validated divided table is updated to update contents of the table. Table updating is realized by the additional writing. In short, writing is performed, without any erasing, by masking the area other than that to which data is newly added (no-selective writing). When table updating is requested from the condition that the update flag of four bits of one memory block is totally set to "1", rewriting is performed to the block in the vacant block area 23, the relevant table is newly created, and the original table is reused as a vacant block. This process lowers the frequency of repeated rewriting of the same nonvolatile memory cell on the table.

<Writing Operation>

Figure 5:
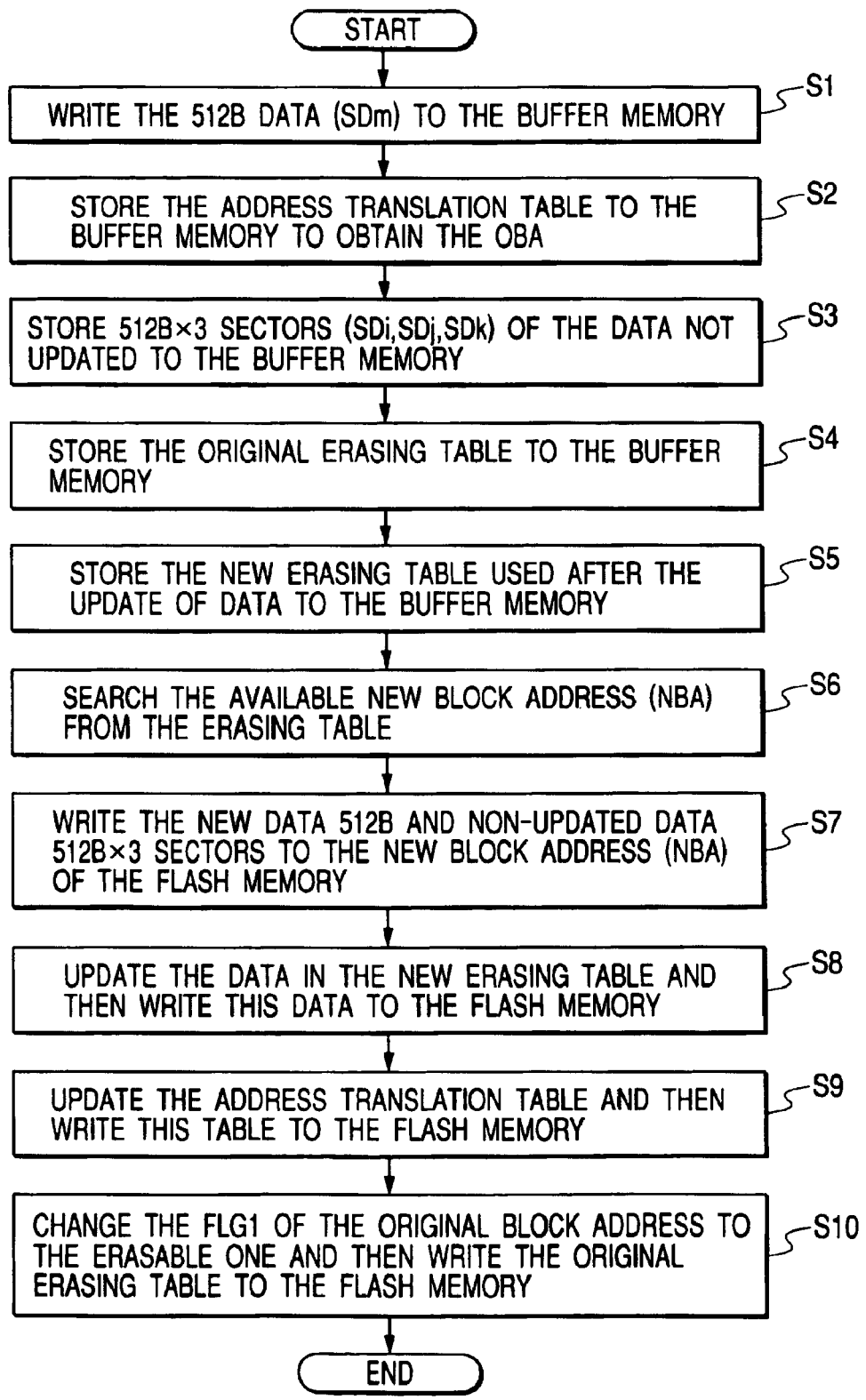
FIG. 5 is a flowchart illustrating an example of the write operation of the memory card utilizing the erasing table and address translating table.
Figure 6:
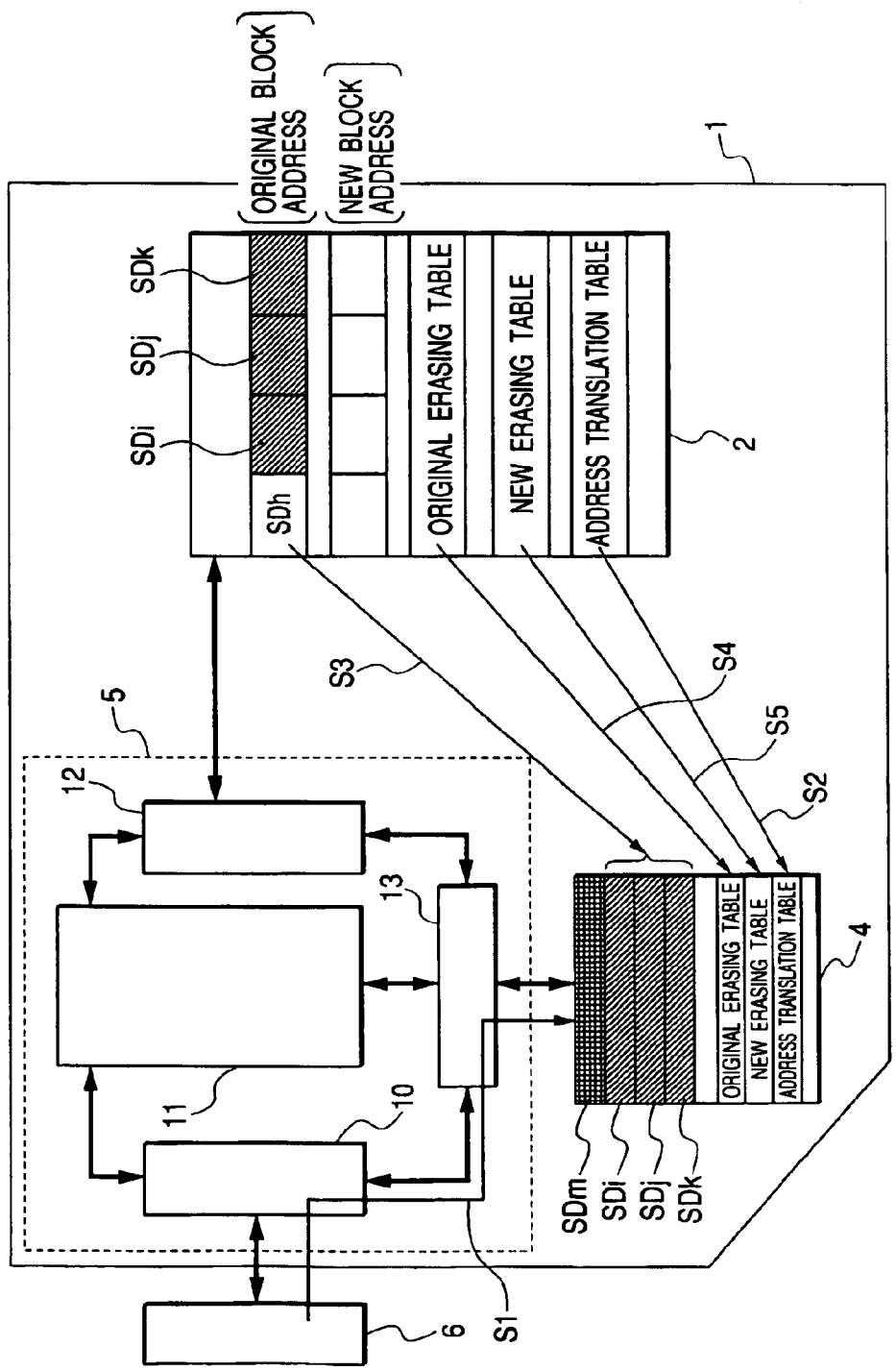
FIG. 6 is a diagram illustrating the major flow of data in the process of FIG. 5.
Figure 7:
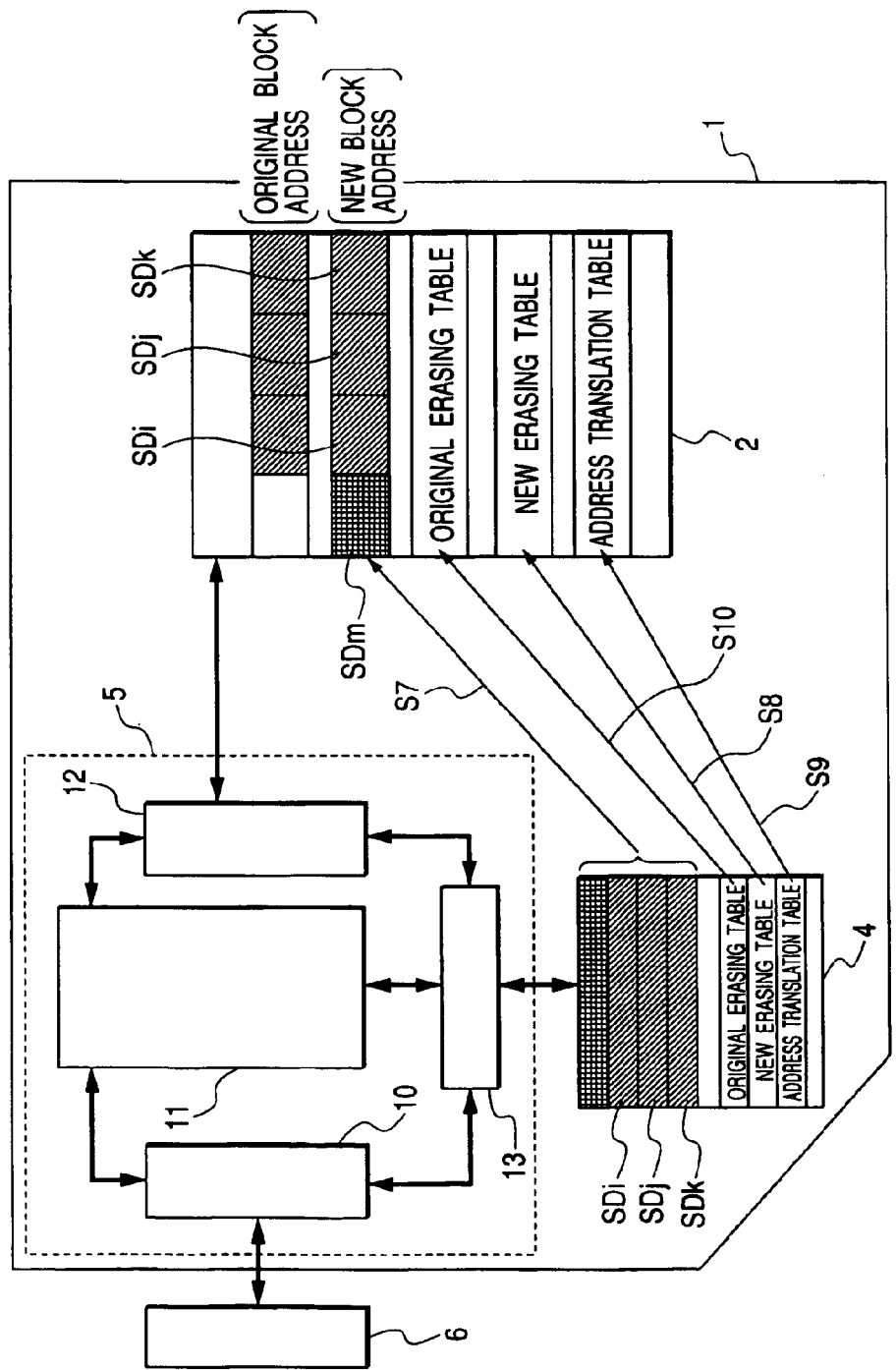
FIG. 7 is a diagram illustrating the major flow of data in the process of FIG. 5.

FIG. 5 illustrates an example of flowchart of the write operation of the memory card using the erasing table 20 and address translation table 21. FIG. 6 and FIG. 7 respectively illustrate major flows of data in the processes of FIG. 5.

The host computer 6 transmits the write data, for example, of 512 bytes to the buffer memory 4 (S1). When the write access instruction for the write data is issued, the card controller 5 stores the address translation table ATT storing the block address corresponding to the logical address LBA (logical sector address) of the write object to the address translation table buffer of the buffer memory 4 from the flash memory 2 (S2). Namely, since the logical address information for indexing the address translation table 21 is allocated in the ascending sequence, the memory block in which the predetermined address translation table is allocated is selected depending on the logical address LBA. The management area of the selected memory block is read first to detect existence of the validated address translation table ATT from the multiplexed area and thereafter the address translation table ATT is read on the basis of such detection. The block address (called an original block address) OBA corresponding at present to the logical address of the write object can be obtained by searching the address translation table obtained.

The card controller 5 reads the data not updated from the data stored in the original block address OBA, stores this data to the data buffer in the buffer memory 4 and then combines this data with the write data from the computer 6 (S3). For example, when the write data is the data SDm for one storage sector, the data SDi, SDj, SDk for three storage sectors are read from the original block address OBA and the data for four storage sectors are defined as data to be updated.

Next, the card controller 5 reads the erasing table (hereinafter referred to as an original erasing table) ET corresponding to the original block address OBA to the original erasing table buffer in the buffer memory 4 (S4). The erasing table to be read is a valid table among the four erasing tables multiplexed in one erasing table block. Here, as described above, divided and allocated one erasing table is multiplexed and only one erasing table multiplexed with reference to the condition of the flag to be updated within the management area is read.

Next, the microprocessor 11 performs the control to store the erasing table (new erasing table) to be used after the update of data to the buffer memory 4 (S5). For example, the microprocessor 11 executes an artificial random number generating program within a program ROM 16 to obtain a search start block address for obtaining a block address (new block address) as the destination of the write data. The card controller 5 stores the new erasing table corresponding to the search start block address obtained as described above to the buffer memory 4. In this case, one valid erasing table multiplexed within the erasing table block is stored in the buffer memory 4 as described above.

Here, the memory controller 5 searches an available new block address (NBA) from the new erasing table stored in the buffer memory 4 (S6). Namely, the vacant information flag FLG1 and erased area flag FLG2 are searched in the ascending or descending sequence from the search start block address obtained by executing a pseudo random number generation program of the new erasing table ET read to the memory buffer 4 and the block address corresponding to the first position where both flags FLG1, FLG2 forming a pair become "1" is defined as a new block address NBA of the available and erased block.

The new block address NBA is already subjected to the erasing process. As will be described later in detail, the erasable data is previously erased with the erasing process based on the pre-erasing control in response to the command which is different for the write and erase operations or during the period not responding to the command supplied from the host computer. Accordingly, when the new block address NBA is obtained, the write process is immediately performed with the update data generated in the step S2 for the memory block of the new block address (S7). The write process is determined whether it is completed successfully or unsuccessfully. If the write operation is unsuccessful, the vacant information flag FLG1 corresponding to the new block address in relation to a write error is updated to the erasing no-acknowledgment condition "0" on the new erasing table read to the buffer memory 4. Thereafter, another erasing acknowledgment block address is searched from the new erasing table to start again the process from the intermediate portion after returning to the step S6.

When the write process in the step S7 is determined as successful, the vacant information flag FLG1 corresponding to the new block address is set first to the erasing no-acknowledgment condition while the erased area flag FLG2 is set to the non-erased area on the new erasing table read to the buffer memory 4, and the data of the updated new erasing table is written, as the update data, into the memory block of the relevant new erasing table on the flash memory 2 (S8). Next, the block address corresponding to the logical address of the present access object is updated to the new block address NBA from the original block address OBA on the address translation table ATT read to the buffer memory 4 and the data of the updated address translation table is written, as the update data, to the memory block of the relevant address translation table on the flash memory 2 (S9). Finally, the vacant information flag FLG1 corresponding to the original block address is set to the erasing acknowledgment condition on the original erasing table read to the buffer memory 4 and the data of the updated original erasing table is written, as the update data, to the memory block of the relevant original erasing table on the flash memory 2 (S10).

Here, in FIG. 6, the block data of the original block address includes the sector data SDh, SDi, SDj, SDk and the sector data SDh among such block data is updated to the sector data SDm with the write access from the host computer 6 on the new block address NBA.

As is apparent from FIG. 6 and FIG. 7, even when the update data SDm, SDi, SDj, SDk are written (S7) to the memory block of the new block address NBA in the step S7, the data SDh, SDi, SDj, SDk before the update are left as they are in the memory block at the original block address OBA. On the flash memory 2, the original erasing table and address translation table are also left as they are.

Accordingly, the preceding data are left as they are even when the operating power is disconnected because the memory card 1 is removed from the card slot or the supply voltage during the operation of host computer 6 becomes unstable before the completion of write operation in the step S7. The reason is that the memory block to which the update data is written is different from the memory block of the original data to be updated. Moreover, after the wiring of the update data in the step S7 is over, the new erasing table in which the new block address NBA is set to the erasing no-acknowledgment condition is written back to the flash memory 2 (S8). With completion of process in the step S8, prevention of unwanted erasing of the data written into the new block address NBA is guaranteed. Next, the address translation table in which the original block address OBA is updated to the new block address NBA is written back to the flash memory 2 (S9). Accordingly, access to the new block address can be realized. The original erasing table updated in the setting is finally written back (S10). Upon completion of this writing, erasing of the memory block data of the original block address OBA can be acknowledged. Even if the process of the step S10 is interrupted due to the power disconnection, reuse of the memory block at the original block address is disabled and the valid storage area is reduced in size, but this does not affect required data access.

As is apparent from above description, processing sequence of the steps S8, S9, S10 is important to thoroughly prevent losing of data due to unwanted disconnection of power source and easily realize logical matching in management of the storage information. Namely, first, after execution (S8) of the protection process with no-acknowledgment of erasing for the data of the new block address, the process (S9) for making it difficult to obtain the data left in the original block address and the process (S10) for acknowledging the erasing of data left in the original block address are performed. For example, when the process of the step S10 is completed by sequentially replacing the process of S8 and the process of S10, the condition for acknowledging the erasing is generated for both new block address and original block address. When disconnection of power source is also generated, here rises the possibility that the condition for acknowledgment of the erasing for both addresses is maintained and necessary data is erased undesirably.

<Pre-erasing Control>

Timings for erasing the erasable data with the pre-erasing control will then be described below.

Figure 8:
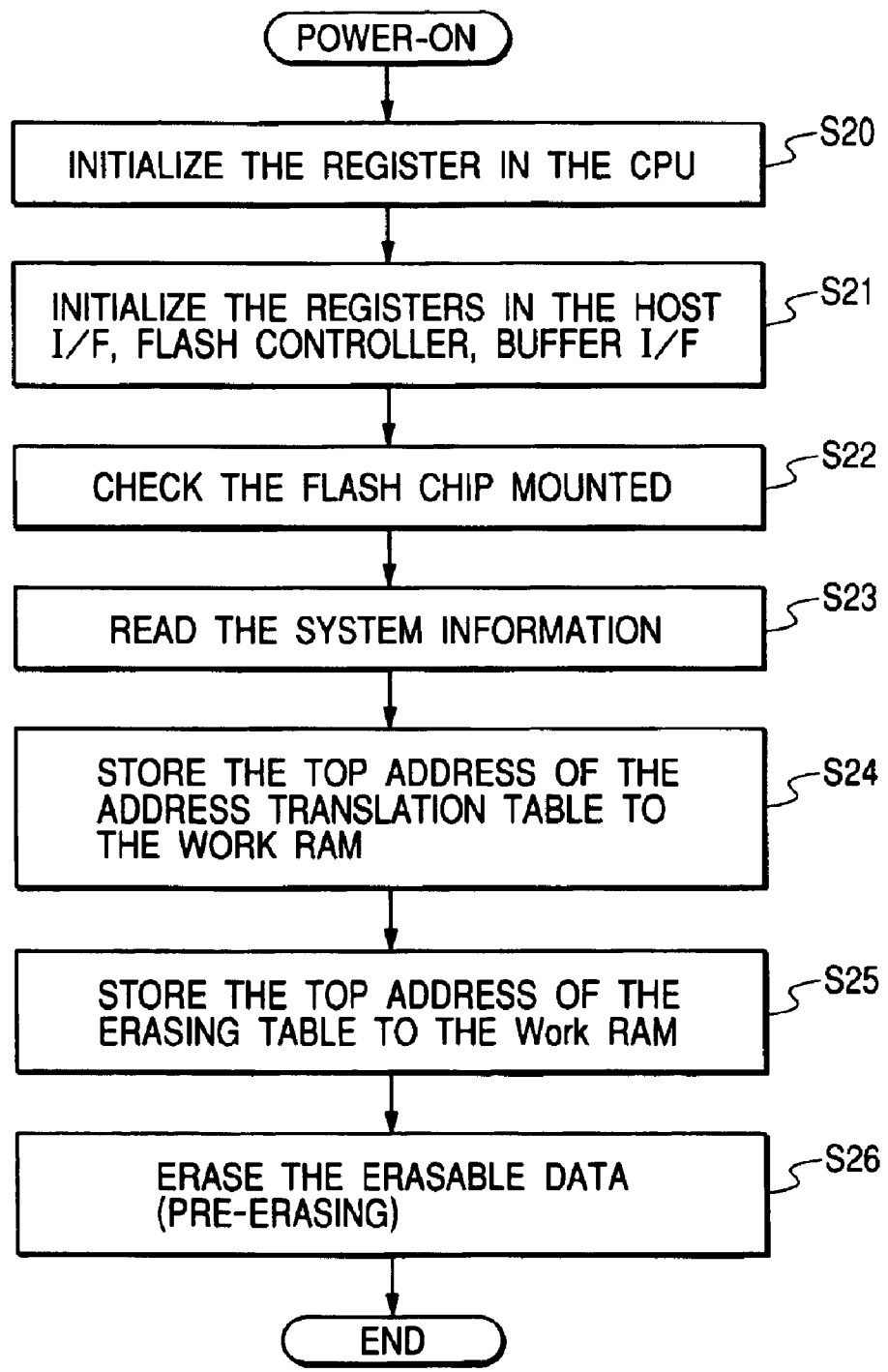
FIG. 8 is a flowchart for execution of the pre-erasing control in response to the power-on operation of the memory card.

First, the erasable data is erased as a part of the power-on operation. FIG. 8 illustrates an example of the flowchart for executing the pre-erasing control in response to the power-on operation of the memory card. When the power switch of the memory card 1 is turned ON, register initialization of the CPU 15 (S20) and register initialization for host interface circuit 10, flash controller 12 and buffer controller 13 (S21) are executed. Thereafter, the flash memory mounted to the memory card 1 is confirmed (S22) and the system information is read from the flash memory 2 (S23). Next, the top address of the address translation table stored on the flash memory 2 is obtained and is then stored to the work RAM 17 (S24). Similarly, the top address of the erasing table stored on the flash memory 2 is also obtained and is then stored to the work RAM 17 (S25). In the subsequent timing, the card controller erases the erasable data of the memory block (S26). The erasing sequence will be described later.

Figure 9:
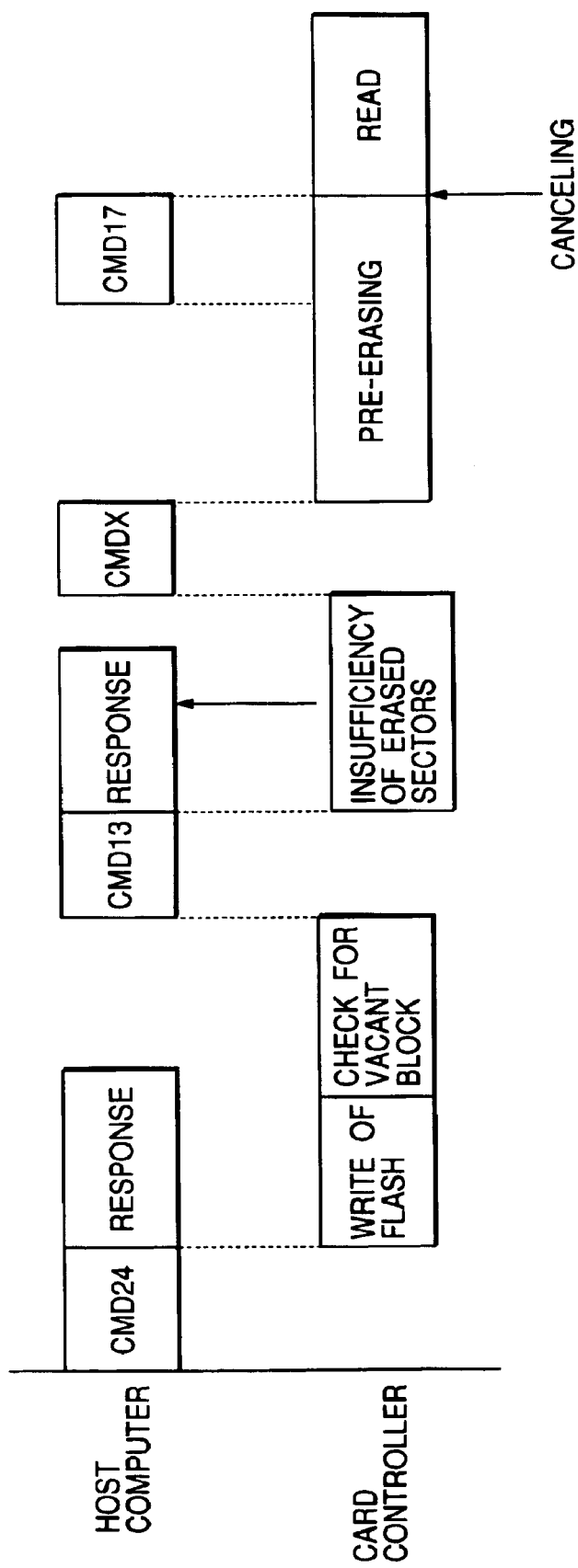
FIG. 9 is an operation timing chart for erasing the erasable data in response to the predetermined exclusive command

Secondly, the erasable data is erased in response to an exclusive command. FIG. 9 illustrates an example of the operation timing chart for erasing of the erasable data (pre-erasing) in response to the predetermined exclusive command (CMDX). When the host computer 6 issues a write command CMD 24, the card controller 5 writes the data to the flash memory 2 (flash write) in response to such command. The host computer 6 waits for a response to the command from the card controller 5. The card controller 5 also executes a vacant check process following the write operation. The vacant check means a process to determine the number of memory blocks which are acknowledged for erasing (FLG1="1") but are not yet erased (FLG2="0") using the erasing table 20. After the vacant check time has passed, the host computer 6 issues a status read command CMD 13 to the card controller 5. The card controller 5 outputs a result of vacant check and the host computer 6 receives this output as a response. For example, upon reception of the vacant check result indicating that there are many memory blocks which are acknowledged for erasing but are not yet erased, the host computer 6 issues the pre-erasing command CMDX to the card controller 5. This pre-erasing command CMDX is the exclusive command of pre-erasing and is different from only an erasing command for designating the erasing object address. The pre-erasing command CMDX is not accompanied with designation of the easing object address.

For example, when it is detected with the vacant check that there are many memory blocks which are acknowledged for erasing but is not yet erased, the card controller 5 sends a request for issuance of the pre-erasing command CMDX to the host computer 6 and the host computer 6 issues the pre-erasing command CMDX to the card controller 5.

The card controller 5 erases the erasable data of the memory block in response to the pre-erasing command. The erasing sequence will be described later. When the host computer 6 issues an access command or the like (for example, a read command CMD 17) during the pre-erasing, the card controller 5 stops the erasing process of the erasable data and shifts to the process in response to the relevant access command. Accordingly, the host computer 6 can immediately send the read or write access request as required without any waiting time.

Figure 10:
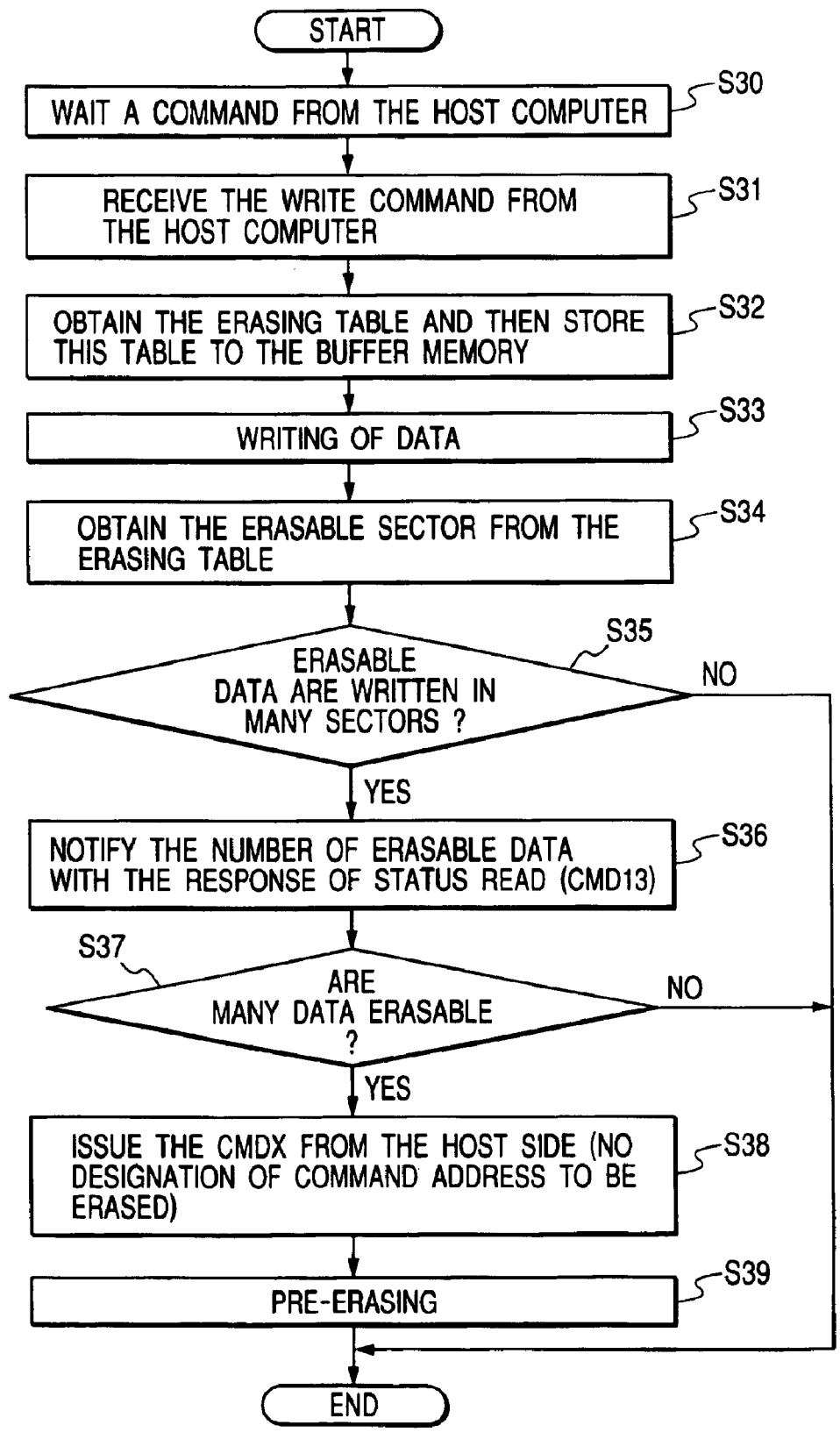
FIG. 10 is a flowchart of the processes up to the pre-erasing from the write request described in regard to FIG. 9.

FIG. 10 illustrates an example of flowchart of the processes to the pre-erasing from the write request described in regard to FIG. 9. The card controller 5 is set to accept a command from the host computer 6 (S30). Upon acceptance (S31) of the write command (CMD24) from the host computer 6 under this condition, the original erasing table or the like is stored to the buffer memory from the flash memory 2 in response to the write object address as described above (S32), the data is written to the block searched by using the new erasing table (S33). Thereafter, the vacant check process is started. In this process, the block which is acknowledged for erasing (FLG1="1") is searched with reference to the original erasing table used in the write operation and the number of blocks holding the erasable data is determined (S34). In short, the number of blocks which are acknowledged for erasing (FLG1="1") but are not yet erased 8FLG2="0") is determined (S35). For example, it is assumed that there are many blocks exceeding 20% of the total number of blocks. In this case, the result is returned to the host computer 6 in response to the status read command CMD13 (S36). When there are many erasable data (YES in S37), the host computer 6 issues a pre-erasing command (CMD0) (S38) and the card controller 5 executes the pre-erasing using the original erasing table searched in response to such command (S39). When the number of erasable data is rather small (NO in S37), the host computer 6 completes the process without issuance of the pre-erasing command CMDX.

Figure 11:
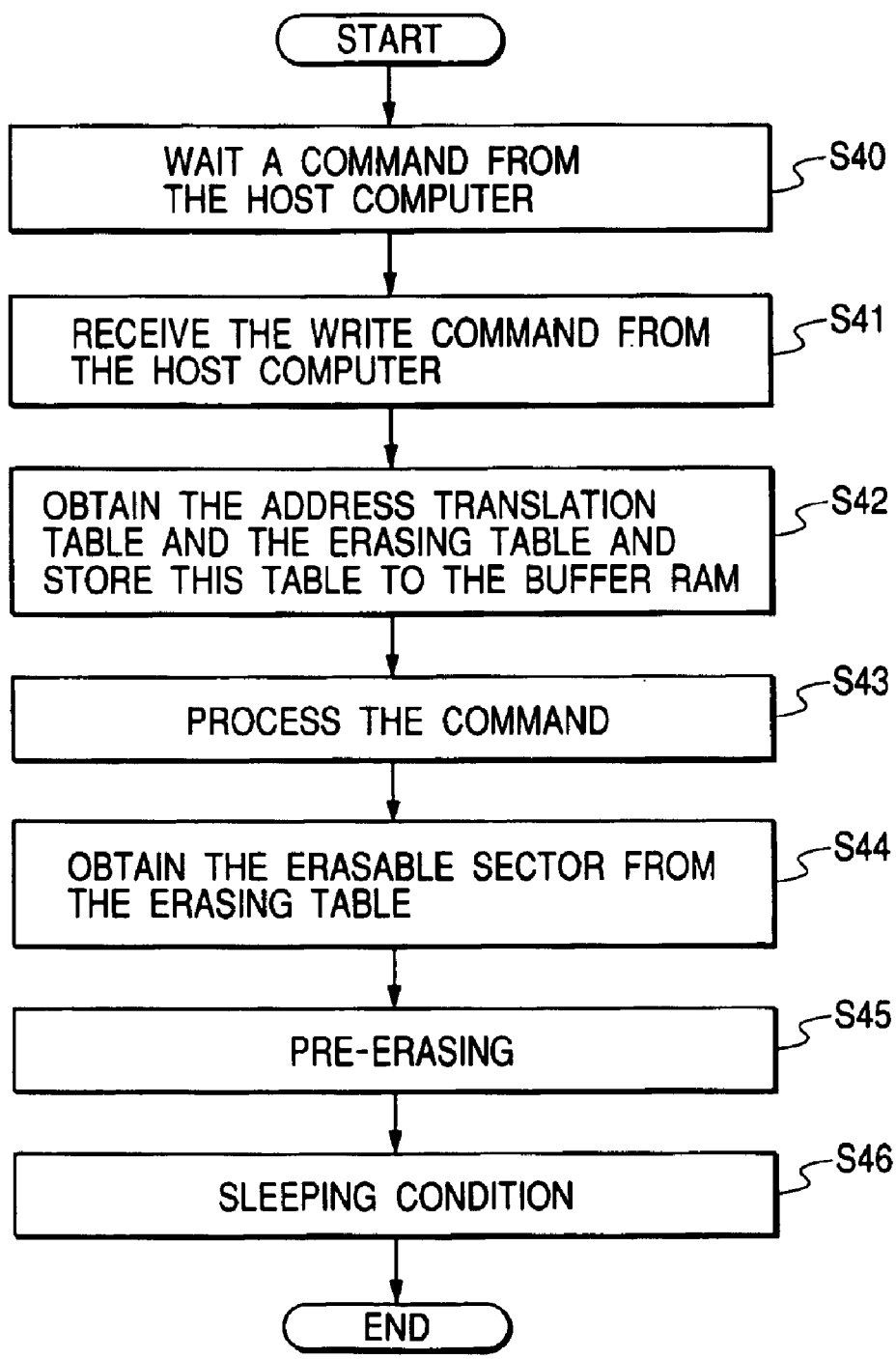
FIG. 11 is a flowchart for starting the pre-erasing in response to the completion of the command process.

Thirdly, the erasable data is erased in response to the completion of the command process. FIG. 11 illustrates an example of the flowchart for starting the pre-erasing in response to the completion of command process, namely before entering the sleep condition. The card controller 5 is set to wait for the command from the host computer 6 (S40) and stores, upon acceptance of the command, for example, the write command (CMD24) from the host computer 6 under this condition (S41), the original erasing table or the like in response to the write object address from the flash memory 2 as described above (S42) and writes the data to the block searched using the new erasing table (S43). The command process is usually completed here and the sleep condition starts. However, in order to start the pre-erasing after the completion of command process, the block which is acknowledged for erasing (FLG1="1") but is not yet erased (FLG2="0") is searched (S44) with reference to the original erasing table on the buffer memory used for data writing and the pre-erasing for the memory block is performed on the basis of the search result (S45). After the completion of pre-erasing, the sleep condition starts (S46). Although not particularly illustrated, when the operation instruction is issued using another access command while the erasing process is sequentially executed for a plurality of memory blocks, the pre-erasing is suspended after the completion of process for the memory block under the erasing process and another access command process is executed preferentially. This process is necessary not to give any delay to operations such as the read operation having higher priority.

Figure 12:
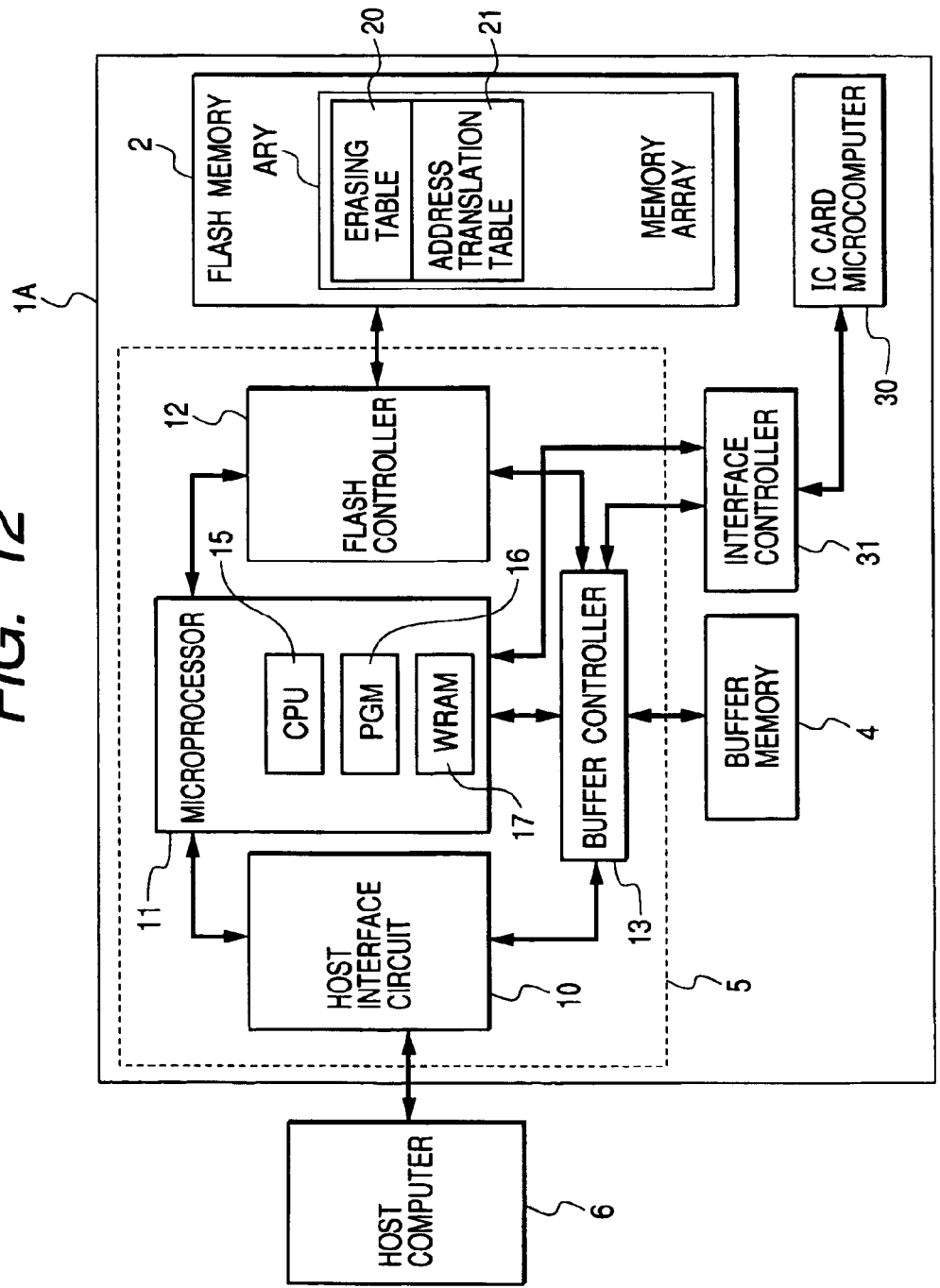
FIG. 12 a block diagram illustrating an example of the memory card comprising a built-in security function.

Fourthly, the erasable data is erased in parallel to the cipher arithmetic operation process in response to a security command. FIG. 12 illustrates an example of the memory card 1A comprising a security function. A microcomputer for IC card (also referred to as an IC card microcomputer) 30 and an interface controller 31 are also added to the memory card of FIG. 1. The IC card microcomputer 30 is formed of a one-chip microcomputer to be mounted on the IC card including a CPU (Central Processing Unit) not illustrated, a cipher arithmetic calculation unit, a RAM (Random Access Memory), a ROM (Read-Only Memory) and I/O (Input/Output circuit). The IC card microcomputer 30 stores the authentication information such as authenticated ID information and password. Therefore, legitimacy of access is determined on the basis of the authentication information or the like when the access is made to the personal information or to the financial organization. The cipher arithmetic processes such as encryption and decoding can also be executed using the cipher arithmetic operation unit not illustrated in order to input and output the encrypted information from and to the external side memory card. The input/output interface specification of the IC card microcomputer 30 conforms to the specification of IC card and is controlled by the interface controller 31 for the interface within the card. Operations of the interface controller 31 and IC card microcomputer 30 are instructed from the microprocessor 11. The other structures are identical to FIG. 1.

Figure 13:
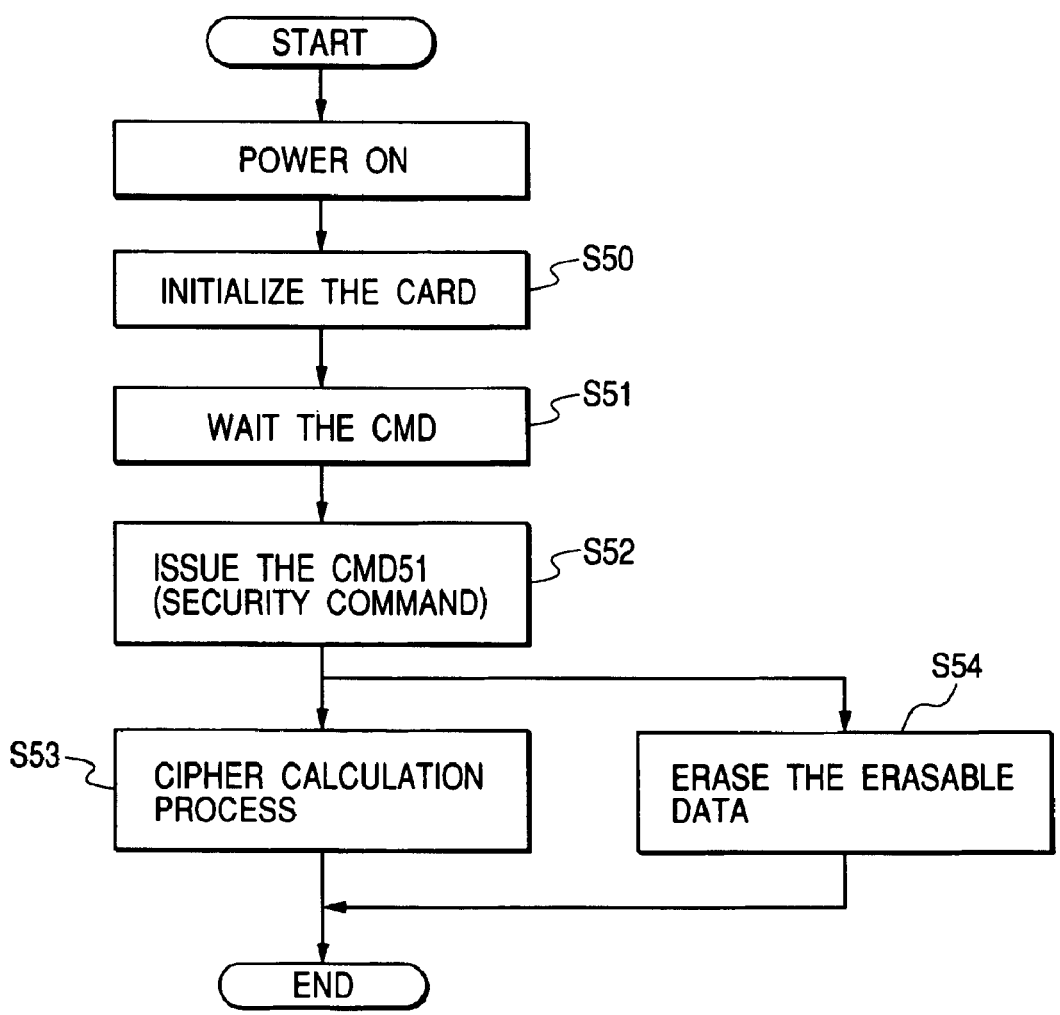
FIG. 13 is a flowchart of the operation to erase the erasable data in parallel to the cipher calculation process.

FIG. 13 illustrates the flowchart of operation for erasing the erasable data in parallel to the cipher arithmetic process. The card initialization process described in regard to FIG. 8 is executed in synchronization with the power-on operation (S50) and the memory card 1A is controlled to the command accepting condition (S51). In this timing, when the card controller 5 accepts the security command represented by CMD51 (S52), the microprocessor 11 controls the IC card microcomputer 30 to execute the cipher arithmetic process (S53) and also controls the flash controller 12 to execute the erasing process of the erasable data in parallel to such cipher arithmetic process (S54).

Figure 14:
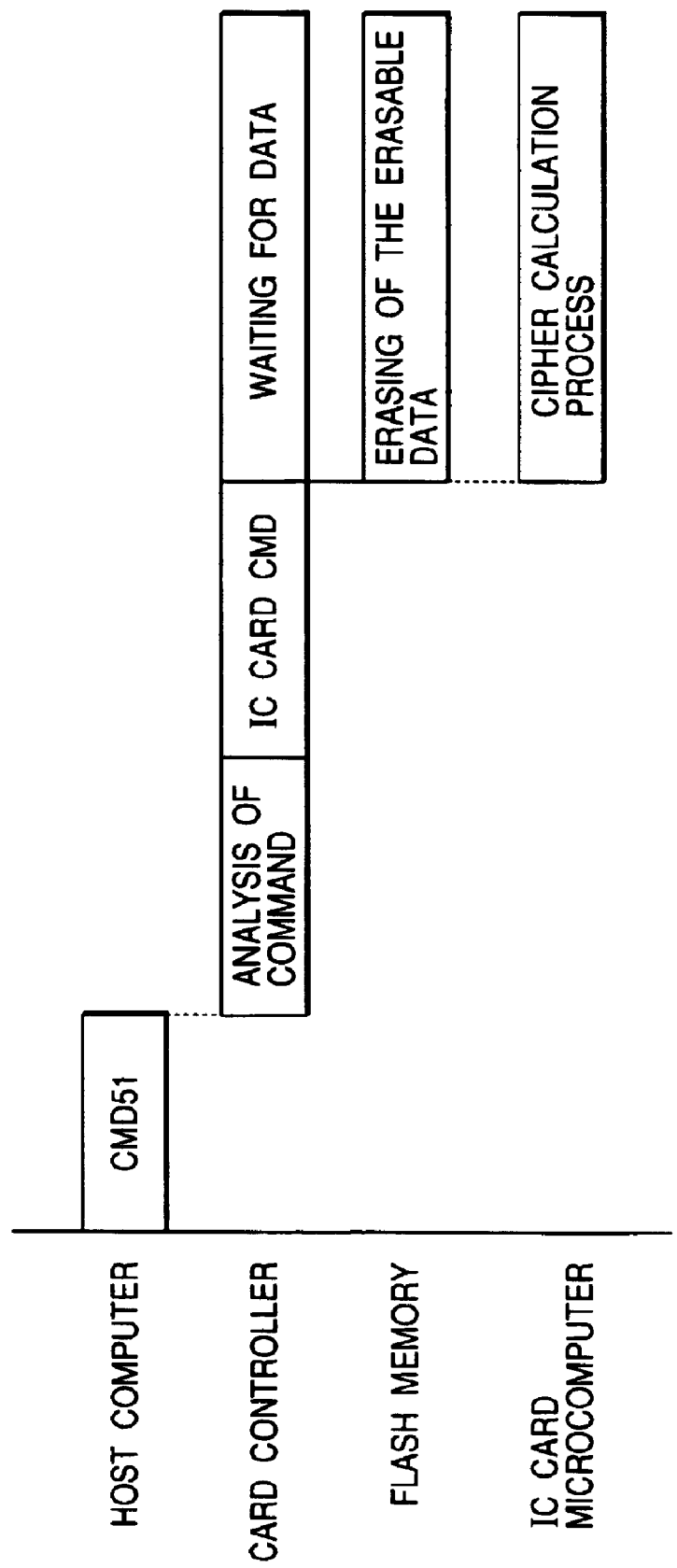
FIG. 14 is a timing chart of the operation in FIG. 13.

FIG. 14 illustrates an example of the timing chart of the operation of FIG. 13. When the host computer 6 issues the security command CMD51, the card controller 5 analyses such command and issues a predetermined IC card command to the IC card microcomputer 30. Accordingly, the IC card microcomputer 30 executes the cipher arithmetic processes such as encryption and decoding. The cipher arithmetic process requires a comparatively longer arithmetic processing time in accordance with the security level of the encryption. During this encryption period, the host computer 6 is waiting for the response data to the IC card command, while the flash memory 2 executes in parallel the erasing process of the erasable data.

<Erasing Process Sequence of Erasable Data>

Figure 15:
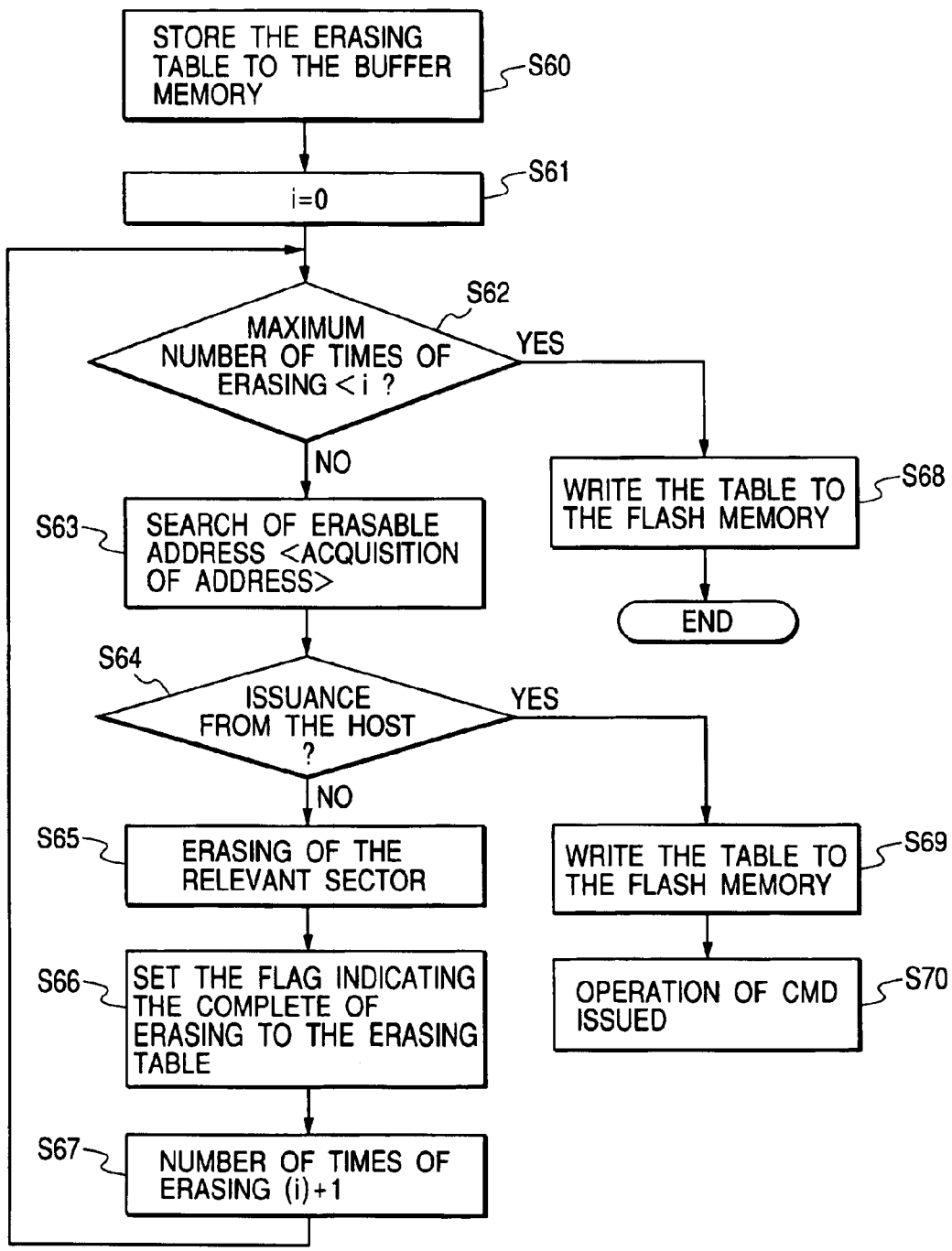
FIG. 15 is a flowchart illustrating an example of the erasable data erasing process sequence.

FIG. 15 illustrates an example of the detail sequence of the erasing process of erasable data (step S26 in FIG. 8, step S39 in FIG. 10, step S45 in FIG. 11 and step S54 in FIG. 13). In the case of erasing process synchronized with the power-on in FIG. 8, it is enough when the erasing table to be stored in the buffer memory 4 is determined, for example, with random logic. When a vacant check is performed following the write operation in FIG. 10, the erasing table used for the vacant check is considered as an object to be stored in the buffer memory 4. When an erasing process is performed before entering a sleep condition in FIG. 11, the original erasing block is considered as an object after the write operation and after other command processes, the object erasing table may be determined, for example, with random logic.

The number of times of erasing operation in the erasing process of the erasable data (or the number of erasing memory blocks) is counted with a number counter i. At the beginning, the number counter i is initialized to 0 (S61). The maximum number of times of the erasing process is given as the fixed value or as a parameter with the command. When the value of the number counter i is smaller than the maximum number of times of erasing process, the erasable address, namely the block address which is acknowledged for erasing (FLG1="1") and is not yet erased (FLG2="0") is searched from the erasing table. Before the erasing process of the searched block address is started, it is determined whether the access command is issued from the host computer 6 or not (S64). When the access command is not yet issued, the search block address is erased (S56). After the erasing of this access command, the second flag FLG2 of the corresponding block address of the erasing table is set to "1" to change the condition to the erased area (S66). Thereafter, the value of number counter i is incremented by one (1). Here, the process returns to the step S62 to repeat the processes described above.

When the value of number counter i reaches the maximum number of times of the erasing process in the step S62, the erasing table on the buffer memory 4 is written back to the flash memory 2 (S68) and the process is completed. When the issuance of command from the host computer 6 is detected in the step S64, the erasing table on the buffer memory 4 is written back to the flash memory 2 (S69) and the processing mode shifts to the process of the new command (S70).

Figure 16:
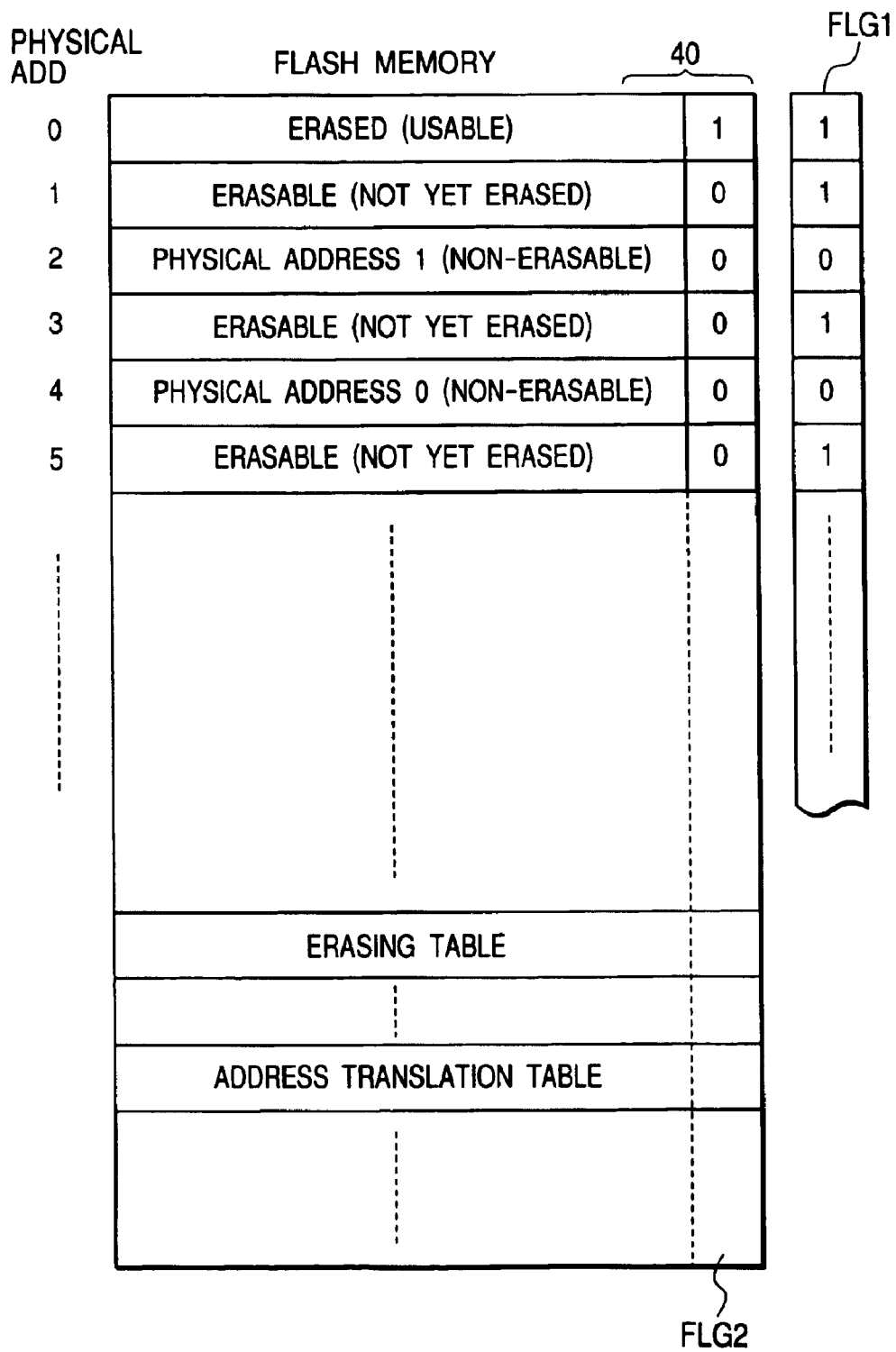
FIG. 16 is a diagram illustrating an example of the memory array for assigning the erased area flag to one bit of the management area of each memory block.

FIG. 16 illustrates an example of the memory array ARY for assigning the erased area flag FLG2 to one bit of the management area of each memory block. In this case, the erasing table is formed, in every block address, corresponding to the vacant information flag FLG1 of one bit. The erased area (available memory block) is indicated by FLG2=1, FLG1=1, erasable condition (not-erased memory block including the erasable data) is indicated by FLG2=0, FLG1=1 and no-erasable condition (memory block used including the valid data) is indicated by FLG2=0, FLG1=0.

Figure 17:
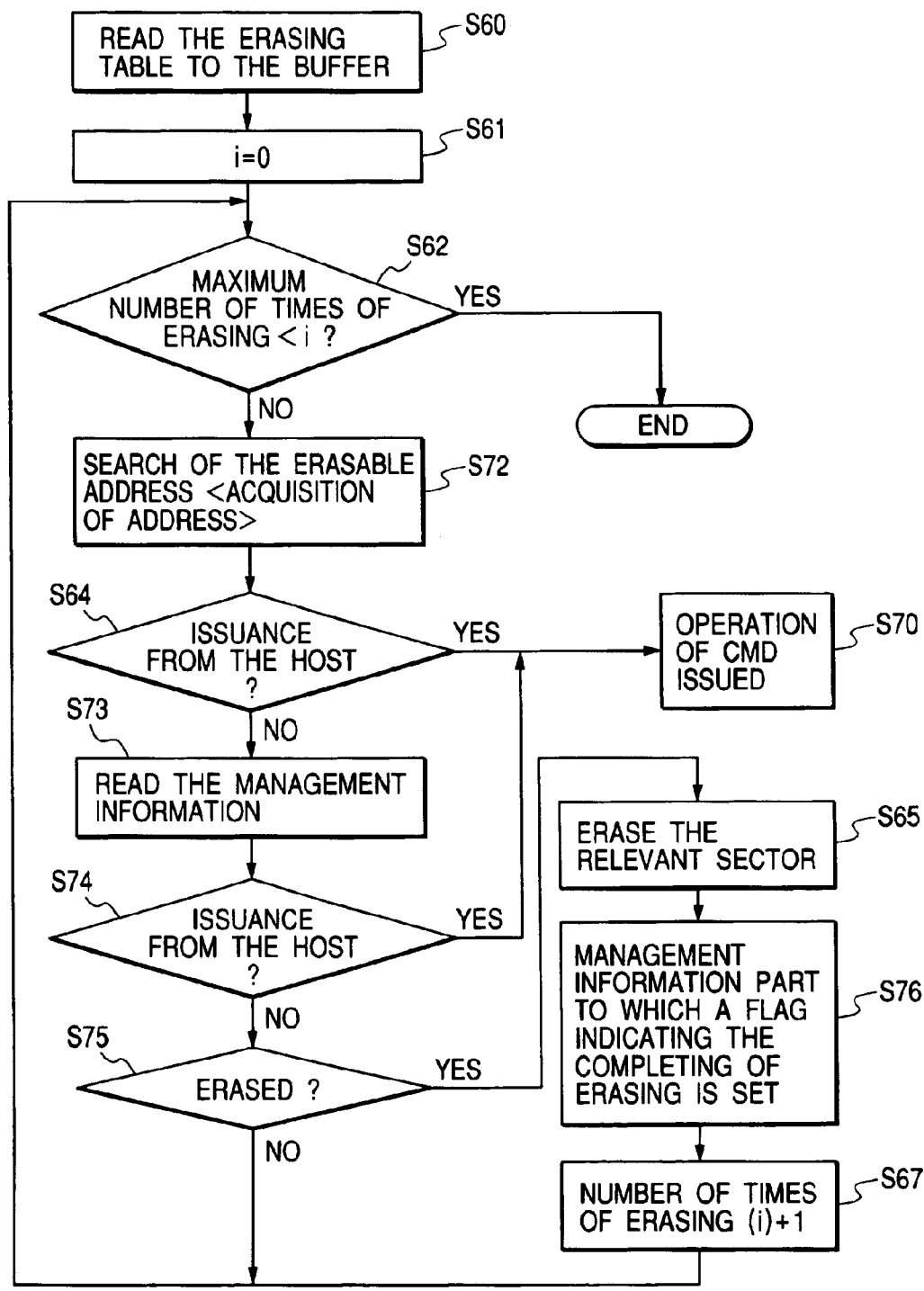
FIG. 17 is a flowchart illustrating an example of the erasable data erasing process sequence when the mode to set the erased area flag to the management area is employed.

FIG. 17 illustrates an example of the erasing process sequence of the erasable data when the profile for setting the erased area flag FLG2 to the management area is employed. Difference from the processing sequence in FIG. 15 is as follows. The erasable address is searched only with the FLG1 of the erasing table (S72). Accordingly, the both erased and erasable memory blocks are searched. For the search memory block, the management information thereof is read (S73) to determine whether the erasing table is erased or not from the FLG2 (S75). The erasing process is executed to the erased memory block (S65). Since the FLG2 is allocated in the management area of the memory block, the FLG2 of the relevant memory block is set to the erased area for every erasing process (S76) and the process to write back the erasing table to the flash memory executed in the steps S68 and S69 in FIG. 15 is no longer required. Issuance of the command from the host computer is detected twice in the steps S64 and S74. The other processes are identical to that in FIG. 15.

<Read Operation>

Figure 18:
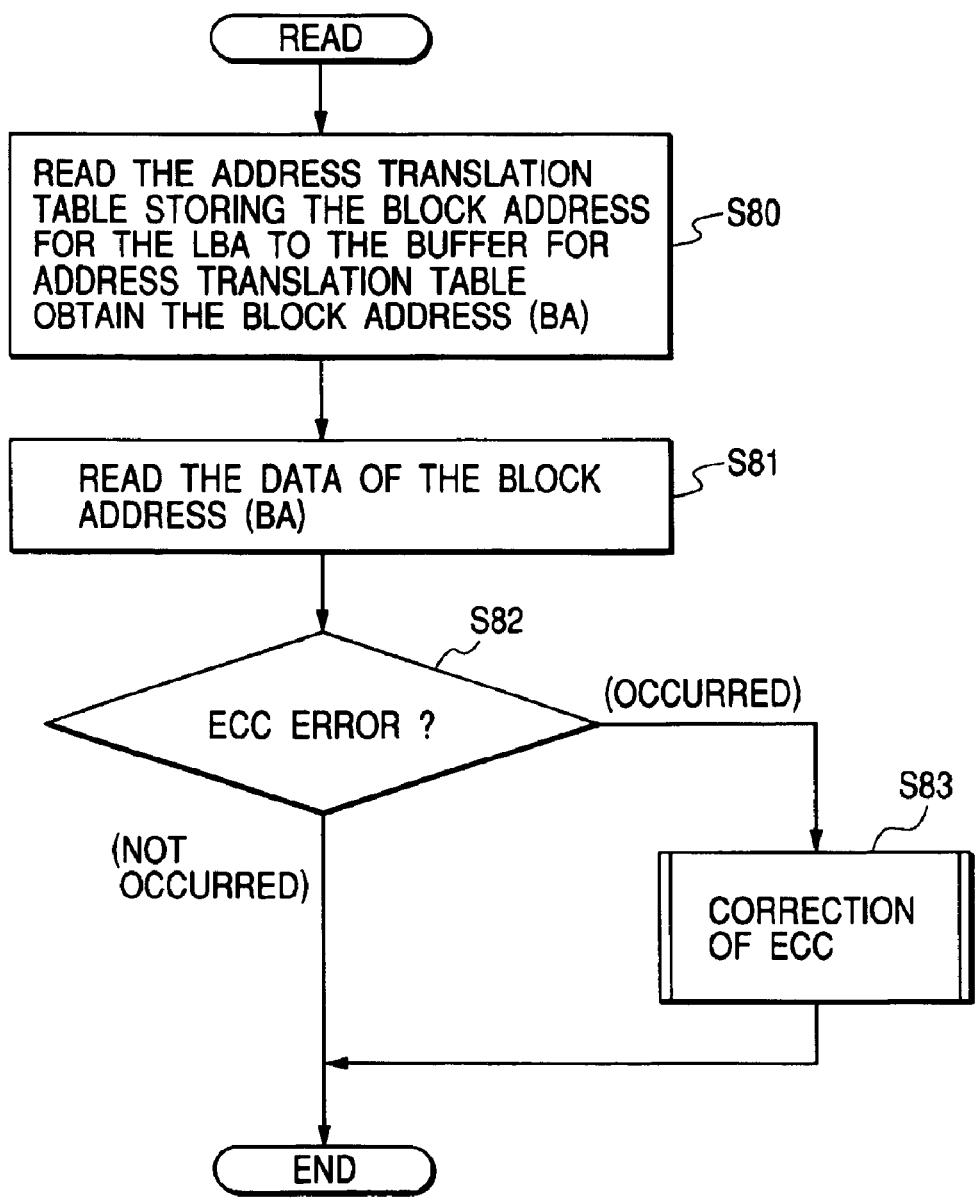
FIG. 18 is a flowchart of the read operation of the memory card utilizing the address translation table.

FIG. 18 illustrates an example of the processing flow of the read operation of the memory card using the address translation table 21. When the host computer 6 sends the read command, the card controller 5 reads the address translation table ATT storing the block address corresponding to the logical address LBA (logical sector address) to the address translation table buffer of the buffer memory 4 (S80). In this timing, since the logical address information for indexing the address translation table 21 is allocated in the ascending sequence, the memory block in which the address translation table is allocated depending on this sequence may be selected. The management area is read first to the selected block, existence of the valid address translation table ATT is detected from the multiplexed memory blocks, and the address translation table ATT can be read on the basis of this detecting operation. The memory block address (BA) corresponding at present to the logical address as the object of read operation can be obtained by searching the address translation table obtained by the read operation (S80).

The card controller 5 reads the data stored in the memory block address BA (S81). Determination of ECC error is made for the read data (S82). When an error is detected, the ECC correction process is executed (S83) and the read data is outputted to the host computer 6.

The present invention proposed by the inventors has been described practically but the present invention is not restricted thereto and may be changed or modified within the scope not departing from the claims thereof.

For example, the number of multiplexing degrees of the erasing table and address translation table is not restricted to four (4) and maybe increased up to two times, namely eight (8) using different memory blocks. In this case, it is preferable to select the sequence of valid table among a plurality of multiplexed tables in order to provide different memory blocks in every time. At the time of updating of the table, a new memory block is different from the original memory block and even if disconnection of power source is generated during the update operation of table, contents of the original table can be left without generation of loss.

Moreover, the cipher arithmetic process is not restricted to only use of the cipher arithmetic circuit but may also be realized using a CPU and an arithmetic operation program. The algorithm of the cipher arithmetic process can employ the adequate arithmetic operation algorithm such as the RSA encryption system which can realize encryption using a public key and also realize decoding using a secret key.

In addition, the erasing process and writing process are not always required to be executed in the unit of word line. The flash memory can introduce not only a structure to store the binary data with only one memory cell but also a structure to store the multi-level information of four-level or higher. The nonvolatile memory is never limited only to the flash memory and may naturally be the memory of the other storage format such as a high dielectric material memory. Moreover, the control circuit like the card controller is not always required to provide the host interface circuit such as IDE and may be applied to the memory card which is standardized to share such function to the host computer.

Effects of the present invention can be described briefly as follows.

Namely, the memory card of the present invention can realize high-speed data writing operations because each erasing process is not required before the data writing operation. Moreover, the memory card of the present invention performs, for updating the data, management of write block address in the erasing table to designate the block address different from the original block address as the write destination. Accordingly, data can be recovered even if unexpected power disconnection occurs during the erasing process.

What is claimed is:

1. A memory card comprising an erasable and programmable nonvolatile memory and a control circuit,
   wherein a memory area of the nonvolatile memory includes a plurality of erasing blocks and is adapted to store an erasing table for storing first flags each of which indicates whether is valid or invalid,
   wherein the memory area includes a plurality of memory calls that have a predetermined threshold voltage, and
   wherein the control circuit has pre-erasing control to erase the datum stored in an erasing block corresponding to a first flag which indicates that a datum is invalid irrespective of an operation instruction from outside for instructing an address for changing the threshold voltage of a memory cell.

2. The memory card according to claim 1,
   wherein the erasing table further includes second flags each to indicate whether a corresponding erasing block, for which the corresponding first flag indicates an invalid datum, is already erased or not, and
   wherein the control circuit performs the pre-erasing control to erase a datum stored in the erasing control to erase a datum stored in the erasing block, for which the corresponding first flag indicates an invalid datum and the corresponding second flag indicates a datum which is not erased.

3. The memory card according to claim 2,
   wherein the erasing table comprises an area for storing the first flags and the second flags.

4. The memory card according to claim 3, wherein the control circuit selects one erasing block having a datum indicated to be invalid by the first flag and a datum indicated to be not erased by the second flag, and erases the datum stored in the one erasing block, and then, changes the second flag corresponding to the one erasing block to indicate an erased condition.

5. The memory card according to claim 4,
   wherein the control circuit selects one erasing block having a datum indicated to be invalid by the first flag and a datum indicated to be erased by the second flag, and stores new datum to the one erasing block, and then changes the first flag corresponding to the one erasing block to indicate a valid condition.

6. The memory card according to claim 5,
   wherein the control circuit changes the first flag corresponding to another erasing block, in which a previous datum is stored, to an invalid condition and changes the second flag corresponding to the another erasing block to a not erased condition.

7. The memory card according to claim 6,
   wherein the memory area of further comprises an address translation table indicating a logical address and a physical address corresponding to the logical address, and
   wherein the control circuit changes the physical addess from the another erasing block, in which the pervious datum had been stored, to the one erasing block, in which the new datum has been and before changing the first flag corresponding to the another erasing block to the invalid condition.

8. The memory card according to claim 1,
   wherein the control circuit executes the pre-erasing control in response to the power-on of the memory card.

9. The memory card according to claim 1, further comprising a cipher arithmetic processing circuit,
   wherein the control circuit executes the pre-erasing control in parallel to the cipher arithmetic process executed with the cipher arithmetic processing circuit in response to a predetermined security command.

10. The memory card according to claim 1,
    wherein the control circuit executes the pre-erasing control in response to a predetermined exclusive command.

11. The memory card according to claim 1,
    wherein the control circuit starts the pre-erasing control in response to the completion of a command process.

12. The memory card according to claim 11,
    wherein when an instruction by another command is issued before or after the start of the erasing operation by the pre-erasing control, the process of the relevant command is executed preferentially.

* * * * *